(12) United States Patent
Chung et al.

(10) Patent No.: US 7,382,515 B2
(45) Date of Patent: Jun. 3, 2008

(54) SILICON-RICH SILICON NITRIDES AS ETCH STOPS IN MEMS MANUFACTURE

(75) Inventors: Wonsuk Chung, San Jose, CA (US); Steve Zee, San Jose, CA (US); Teruo Sasagawa, Los Gatos, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 0 days.

(21) Appl. No.: 11/334,990

(22) Filed: Jan. 18, 2006

(65) Prior Publication Data

US 2007/0170540 A1 Jul. 26, 2007

(51) Int. Cl.
*G02B 26/00* (2006.01)
*G02B 26/08* (2006.01)
*G02B 27/00* (2006.01)
*H01L 21/302* (2006.01)

(52) U.S. Cl. .................... 359/290; 359/302; 359/578; 438/757

(58) Field of Classification Search ............. 359/290, 359/302, 577, 578; 438/52, 53, 757
See application file for complete search history.

(56) References Cited

U.S. PATENT DOCUMENTS

| | | | |
|---|---|---|---|
| 2,534,846 A | 12/1950 | Ambrose et al. | |
| 3,439,973 A | 4/1969 | Paul et al. | |
| 3,443,854 A | 5/1969 | Weiss | |
| 3,616,312 A | 10/1971 | McGriff et al. | |
| 3,653,741 A | 4/1972 | Marks | |
| 3,656,836 A | 4/1972 | de Cremoux et al. | |
| 3,725,868 A | 4/1973 | Malmer, Jr. et al. | |
| 3,813,265 A | 5/1974 | Marks | |
| 3,955,880 A | 5/1976 | Lierke | |
| 4,099,854 A | 7/1978 | Decker et al. | |
| 4,196,396 A | 4/1980 | Smith | |
| 4,228,437 A | 10/1980 | Shelton | |
| 4,377,324 A | 3/1983 | Durand et al. | |
| 4,389,096 A | 6/1983 | Hori et al. | |
| 4,392,711 A | 7/1983 | Moraw et al. | |
| 4,403,248 A | 9/1983 | te Velde | |
| 4,441,791 A | 4/1984 | Hornbeck | |

(Continued)

FOREIGN PATENT DOCUMENTS

CH 681 047 12/1992

(Continued)

OTHER PUBLICATIONS

The European Search Report for EP application No. 05255661.0.

(Continued)

*Primary Examiner*—William C Choi
(74) *Attorney, Agent, or Firm*—Knobbe Martens Olson & Bear, LLP

(57) ABSTRACT

The fabrication of a MEMS device such as an interferometric modulator is improved by employing an etch stop layer between a sacrificial layer and a an electrode. The etch stop may reduce undesirable over-etching of the sacrificial layer and the electrode. The etch stop layer may also serve as a barrier layer, buffer layer, and or template layer. The etch stop layer may include silicon-rich silicon nitride.

34 Claims, 12 Drawing Sheets

U.S. PATENT DOCUMENTS

| | | |
|---|---|---|
| 4,445,050 A | 4/1984 | Marks |
| 4,459,182 A | 7/1984 | te Velde |
| 4,482,213 A | 11/1984 | Piliavin et al. |
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,617,608 A | 10/1986 | Blonder et al. |
| 4,662,746 A | 5/1987 | Hornbeck |
| 4,663,083 A | 5/1987 | Marks |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Bimbach |
| 4,790,635 A | 12/1988 | Apsley |
| 4,856,863 A | 8/1989 | Sampsell et al. |
| 4,859,060 A | 8/1989 | Kitagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,299,041 A | 3/1994 | Morin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,330,617 A | 7/1994 | Haond |
| 5,331,454 A | 7/1994 | Hornbeck |
| 5,339,116 A | 8/1994 | Urbanus et al. |
| 5,345,328 A | 9/1994 | Fritz et al. |
| 5,347,377 A | 9/1994 | Revelli, Jr. et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,503,952 A | 4/1996 | Suzuki et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,578,976 A | 11/1996 | Yao |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,619,059 A | 4/1997 | Li et al. |
| 5,619,365 A | 4/1997 | Rhoades et al. |
| 5,619,366 A | 4/1997 | Rhoads et al. |
| 5,622,814 A | 4/1997 | Miyata et al. |
| 5,629,790 A | 5/1997 | Neukermans et al. |

| | | | | | | |
|---|---|---|---|---|---|---|
| 5,633,652 | A | 5/1997 | Kanbe et al. | 6,195,196 | B1 | 2/2001 | Kimura et al. |
| 5,636,052 | A | 6/1997 | Arney et al. | 6,201,633 | B1 | 3/2001 | Peeters et al. |
| 5,636,185 | A | 6/1997 | Brewer et al. | 6,204,080 | B1 | 3/2001 | Hwang |
| 5,638,084 | A | 6/1997 | Kalt | 6,232,936 | B1 | 5/2001 | Gove et al. |
| 5,638,946 | A | 6/1997 | Zavracky | 6,243,149 | B1 | 6/2001 | Swanson et al. |
| 5,641,391 | A | 6/1997 | Hunter et al. | 6,246,398 | B1 | 6/2001 | Koo |
| 5,646,768 | A | 7/1997 | Kaeiyama | 6,249,039 | B1 | 6/2001 | Harvey et al. |
| 5,647,819 | A | 7/1997 | Fujita et al. | 6,282,010 | B1 | 8/2001 | Sulzbach et al. |
| 5,650,834 | A | 7/1997 | Nakagawa et al. | 6,284,560 | B1 | 9/2001 | Jech et al. |
| 5,650,881 | A | 7/1997 | Hornbeck | 6,295,154 | B1 | 9/2001 | Laor et al. |
| 5,654,741 | A | 8/1997 | Sampsell et al. | 6,323,982 | B1 | 11/2001 | Hornbeck |
| 5,657,099 | A | 8/1997 | Doherty et al. | 6,327,071 | B1 | 12/2001 | Kimura et al. |
| 5,659,374 | A | 8/1997 | Gale, Jr. et al. | 6,329,297 | B1 | 12/2001 | Balish et al. |
| 5,665,997 | A | 9/1997 | Weaver et al. | 6,335,831 | B2 | 1/2002 | Kowarz et al. |
| 5,673,139 | A | 9/1997 | Johnson | 6,351,329 | B1 | 2/2002 | Greywal |
| 5,674,757 | A | 10/1997 | Kim | 6,356,254 | B1 | 3/2002 | Kimura |
| 5,683,591 | A | 11/1997 | Offenberg | 6,376,787 | B1 | 4/2002 | Martin et al. |
| 5,703,710 | A | 12/1997 | Brinkman et al. | 6,391,675 | B1 | 5/2002 | Ehmke et al. |
| 5,706,022 | A | 1/1998 | Hato | 6,392,233 | B1 | 5/2002 | Channin et al. |
| 5,710,656 | A | 1/1998 | Goosen | 6,392,781 | B1 | 5/2002 | Kim et al. |
| 5,726,480 | A | 3/1998 | Pister | 6,407,851 | B1 | 6/2002 | Islam et al. |
| 5,739,945 | A | 4/1998 | Tayebati | 6,447,126 | B1 | 9/2002 | Hornbeck |
| 5,745,193 | A | 4/1998 | Urbanus et al. | 6,452,465 | B1 | 9/2002 | Brown et al. |
| 5,745,281 | A | 4/1998 | Yi et al. | 6,456,420 | B1 | 9/2002 | Goodwin-Johansson |
| 5,771,116 | A | 6/1998 | Miller et al. | 6,465,355 | B1 | 10/2002 | Horsley |
| 5,771,321 | A | 6/1998 | Stern | 6,466,354 | B1 | 10/2002 | Gudeman |
| 5,784,189 | A | 7/1998 | Bozler et al. | 6,466,358 | B2 | 10/2002 | Tew |
| 5,784,190 | A | 7/1998 | Worley | 6,473,274 | B1 | 10/2002 | Maimone et al. |
| 5,784,212 | A | 7/1998 | Hornbeck | 6,480,177 | B2 | 11/2002 | Doherty et al. |
| 5,793,504 | A | 8/1998 | Stoll | 6,496,122 | B2 | 12/2002 | Sampsell |
| 5,808,780 | A | 9/1998 | McDonald | 6,513,911 | B1 | 2/2003 | Ozaki et al. |
| 5,818,095 | A | 10/1998 | Sampsell | 6,522,801 | B1 | 2/2003 | Aksyuk et al. |
| 5,822,110 | A | 10/1998 | Dabbaj | 6,531,945 | B1 | 3/2003 | Ahn et al. |
| 5,822,170 | A | 10/1998 | Cabuz et al. | 6,537,427 | B1 | 3/2003 | Raina et al. |
| 5,824,608 | A | 10/1998 | Gotoch et al. | 6,545,335 | B1 | 4/2003 | Chua et al. |
| 5,825,528 | A | 10/1998 | Goosen | 6,548,908 | B2 | 4/2003 | Chua et al. |
| 5,835,255 | A | 11/1998 | Miles | 6,549,338 | B1 | 4/2003 | Wolverton et al. |
| 5,838,484 | A | 11/1998 | Goosen et al. | 6,552,840 | B2 | 4/2003 | Knipe |
| 5,842,088 | A | 11/1998 | Thompson | 6,574,033 | B1 | 6/2003 | Chui et al. |
| 5,867,302 | A | 2/1999 | Fleming et al. | 6,577,785 | B1 | 6/2003 | Spahn et al. |
| 5,896,796 | A | 4/1999 | Chih | 6,589,625 | B1 | 7/2003 | Kothari et al. |
| 5,912,758 | A | 6/1999 | Knipe et al. | 6,600,201 | B2 | 7/2003 | Hartwell et al. |
| 5,914,803 | A | 6/1999 | Hwang et al. | 6,602,791 | B2 | 8/2003 | Ouellet et al. |
| 5,920,421 | A | 7/1999 | Choi | 6,606,175 | B1 | 8/2003 | Sampsell et al. |
| 5,943,155 | A | 8/1999 | Goossen | 6,608,268 | B1 | 8/2003 | Goldsmith |
| 5,943,158 | A | 8/1999 | Ford et al. | 6,610,440 | B1 | 8/2003 | LaFollette et al. |
| 5,959,763 | A | 9/1999 | Bozler et al. | 6,625,047 | B2 | 9/2003 | Coleman, Jr. |
| 5,967,163 | A * | 10/1999 | Pan et al. ................ 137/1 | 6,630,786 | B2 | 10/2003 | Cummings et al. |
| 5,972,193 | A | 10/1999 | Chou et al. | 6,632,698 | B2 | 10/2003 | Ives |
| 5,976,902 | A | 11/1999 | Shih | 6,635,919 | B1 | 10/2003 | Melendez et al. |
| 5,978,127 | A | 11/1999 | Berg | 6,642,913 | B1 | 11/2003 | Kimura et al. |
| 5,986,796 | A | 11/1999 | Miles et al. | 6,643,069 | B2 | 11/2003 | Dewald |
| 6,016,693 | A | 1/2000 | Viani et al. | 6,650,455 | B2 | 11/2003 | Miles |
| 6,028,690 | A | 2/2000 | Carter et al. | 6,653,997 | B2 | 11/2003 | Van Gorkom et al. |
| 6,031,653 | A | 2/2000 | Wang | 6,657,832 | B2 | 12/2003 | Williams et al. |
| 6,038,056 | A | 3/2000 | Florence et al. | 6,666,561 | B1 | 12/2003 | Blakley |
| 6,040,937 | A | 3/2000 | Miles | 6,674,562 | B1 | 1/2004 | Miles et al. |
| 6,049,317 | A | 4/2000 | Thompson et al. | 6,674,563 | B1 | 1/2004 | Chui et al. |
| 6,055,090 | A | 4/2000 | Miles | 6,680,792 | B2 | 1/2004 | Miles |
| 6,057,903 | A | 5/2000 | Colgan et al. | 6,687,896 | B1 | 3/2004 | Miles |
| 6,061,075 | A | 5/2000 | Nelson et al. | 6,710,908 | B2 | 3/2004 | Miles et al. |
| 6,097,145 | A | 8/2000 | Kastalsky et al. | 6,720,267 | B1 | 4/2004 | Chen et al. |
| 6,099,132 | A | 8/2000 | Kaeriyama | 6,736,987 | B1 | 5/2004 | Cho |
| 6,100,872 | A | 8/2000 | Aratani et al. | 6,741,377 | B2 | 5/2004 | Miles |
| 6,113,239 | A | 9/2000 | Sampsell et al. | 6,741,384 | B1 | 5/2004 | Martin et al. |
| 6,115,326 | A | 9/2000 | Puma et al. | 6,741,503 | B1 | 5/2004 | Farris et al. |
| 6,147,790 | A | 11/2000 | Meier et al. | 6,743,570 | B2 | 6/2004 | Harnett et al. |
| 6,158,156 | A | 12/2000 | Patrick | 6,747,785 | B2 | 6/2004 | Chen et al. |
| 6,160,833 | A | 12/2000 | Floyd et al. | 6,747,800 | B1 | 6/2004 | Lin |
| 6,166,422 | A | 12/2000 | Qian et al. | 6,756,317 | B2 | 6/2004 | Sniegowski et al. |
| 6,170,332 | B1 | 1/2001 | MacDonald et al. | 6,760,146 | B2 | 7/2004 | Ikeda et al. |
| 6,180,428 | B1 | 1/2001 | Peeters et al. | 6,768,097 | B1 | 7/2004 | Vikorovitch et al. |
| 6,194,323 | B1 | 2/2001 | Downey et al. | 6,775,174 | B2 | 8/2004 | Huffman et al. |

| | | | | | | |
|---|---|---|---|---|---|---|
| 6,778,155 B2 | 8/2004 | Doherty et al. | | 2003/0062186 A1 | 4/2003 | Boroson et al. |
| 6,778,306 B2 | 8/2004 | Sniegowski et al. | | 2003/0072070 A1 | 4/2003 | Miles |
| 6,794,119 B2 | 9/2004 | Miles | | 2003/0090350 A1 | 5/2003 | Feng et al. |
| 6,811,267 B1 | 11/2004 | Allen et al. | | 2003/0091072 A1 | 5/2003 | Wang et al. |
| 6,812,482 B2 | 11/2004 | Fleming et al. | | 2003/0112096 A1 | 6/2003 | Potter |
| 6,819,469 B1 | 11/2004 | Koba | | 2003/0119221 A1 | 6/2003 | Cunningham et al. |
| 6,822,628 B2 | 11/2004 | Dunphy et al. | | 2003/0123126 A1 | 7/2003 | Meyer et al. |
| 6,829,132 B2 | 12/2004 | Martin et al. | | 2003/0138213 A1 | 7/2003 | Jiin et al. |
| 6,853,129 B1 | 2/2005 | Cummings et al. | | 2003/0152872 A1 | 8/2003 | Miles |
| 6,855,610 B2 | 2/2005 | Tung et al. | | 2003/0201784 A1 | 10/2003 | Potter |
| 6,859,218 B1 | 2/2005 | Luman et al. | | 2003/0202264 A1 | 10/2003 | Weber et al. |
| 6,859,301 B1 | 2/2005 | Islam et al. | | 2003/0202265 A1 | 10/2003 | Reboa et al. |
| 6,861,277 B1 | 3/2005 | Monroe et al. | | 2003/0202266 A1 | 10/2003 | Ring et al. |
| 6,862,022 B2 | 3/2005 | Slupe | | 2003/0215974 A1 | 11/2003 | Kawasaki et al. |
| 6,862,029 B1 | 3/2005 | D'Souza et al. | | 2003/0231373 A1 | 12/2003 | Kowarz et al. |
| 6,867,896 B2 | 3/2005 | Miles | | 2004/0010115 A1 | 1/2004 | Sotzing |
| 6,870,581 B2 | 3/2005 | Li et al. | | 2004/0027636 A1 | 2/2004 | Miles |
| 6,870,654 B2 | 3/2005 | Lin et al. | | 2004/0027701 A1 | 2/2004 | Ishikawa |
| 6,882,458 B2 | 4/2005 | Lin et al. | | 2004/0028849 A1 | 2/2004 | Stark et al. |
| 6,882,461 B1 | 4/2005 | Tsai et al. | | 2004/0035821 A1 | 2/2004 | Doan et al. |
| 6,905,621 B2 | 6/2005 | Ho et al. | | 2004/0051929 A1 | 3/2004 | Sampsell et al. |
| 6,912,022 B2 | 6/2005 | Lin et al. | | 2004/0053434 A1 | 3/2004 | Bruner |
| 6,940,631 B2 | 9/2005 | Ishikawa | | 2004/0058531 A1 | 3/2004 | Miles et al. |
| 6,952,303 B2 | 10/2005 | Lin et al. | | 2004/0058532 A1 | 3/2004 | Miles et al. |
| 6,952,304 B2 | 10/2005 | Mushika et al. | | 2004/0061543 A1 | 4/2004 | Nam et al. |
| 6,958,847 B2 | 10/2005 | Lin | | 2004/0063322 A1 | 4/2004 | Yang |
| 6,980,350 B2 | 12/2005 | Hung et al. | | 2004/0070813 A1 | 4/2004 | Aubuchon |
| 6,982,820 B2 | 1/2006 | Tsai | | 2004/0080807 A1 | 4/2004 | Chen et al. |
| 6,987,432 B2 | 1/2006 | Lutz et al. | | 2004/0080832 A1 | 4/2004 | Singh |
| 6,995,890 B2 | 2/2006 | Lin | | 2004/0087086 A1 | 5/2004 | Lee |
| 6,999,225 B2 | 2/2006 | Lin | | 2004/0100677 A1 | 5/2004 | Huibers et al. |
| 6,999,236 B2 | 2/2006 | Lin | | 2004/0124073 A1 | 7/2004 | Pilans et al. |
| 7,006,272 B2 | 2/2006 | Tsai | | 2004/0125281 A1 | 7/2004 | Lin et al. |
| 7,016,095 B2 | 3/2006 | Lin | | 2004/0125282 A1 | 7/2004 | Lin et al. |
| 7,016,099 B2 | 3/2006 | Ikeda et al. | | 2004/0125536 A1 | 7/2004 | Arney et al. |
| 7,027,202 B1 | 4/2006 | Hunter et al. | | 2004/0136076 A1 | 7/2004 | Tayebati |
| 7,042,643 B2 | 5/2006 | Miles et al. | | 2004/0145049 A1 | 7/2004 | McKinnell et al. |
| 7,110,158 B2 | 9/2006 | Miles | | 2004/0145811 A1 | 7/2004 | Lin et al. |
| 7,123,216 B1 | 10/2006 | Miles | | 2004/0147056 A1 | 7/2004 | McKinnell et al. |
| 7,142,346 B2 * | 11/2006 | Chui et al. ................ 359/290 | | 2004/0147198 A1 | 7/2004 | Lin et al. |
| 7,161,730 B2 | 1/2007 | Floyd | | 2004/0148009 A1 | 7/2004 | Buzzard |
| 7,193,768 B2 | 3/2007 | Lin | | 2004/0150869 A1 | 8/2004 | Kasai |
| 7,233,029 B2 | 6/2007 | Mochizuki | | 2004/0160143 A1 | 8/2004 | Shreeve et al. |
| 2001/0003487 A1 | 6/2001 | Miles | | 2004/0174583 A1 | 9/2004 | Chen et al. |
| 2001/0010953 A1 | 8/2001 | Kang et al. | | 2004/0175577 A1 | 9/2004 | Lin et al. |
| 2001/0026951 A1 | 10/2001 | Vergani et al. | | 2004/0179281 A1 | 9/2004 | Reboa |
| 2001/0040649 A1 | 11/2001 | Ozaki | | 2004/0179445 A1 | 9/2004 | Park |
| 2001/0040675 A1 | 11/2001 | True et al. | | 2004/0191937 A1 | 9/2004 | Patel et al. |
| 2001/0055208 A1 | 12/2001 | Kimura | | 2004/0197526 A1 | 10/2004 | Mehta |
| 2002/0015215 A1 | 2/2002 | Miles | | 2004/0207497 A1 | 10/2004 | Hsu et al. |
| 2002/0021485 A1 | 2/2002 | Pilossof | | 2004/0207897 A1 | 10/2004 | Lin |
| 2002/0024711 A1 | 2/2002 | Miles | | 2004/0209192 A1 | 10/2004 | Lin et al. |
| 2002/0031155 A1 | 3/2002 | Tayebati et al. | | 2004/0209195 A1 | 10/2004 | Lin |
| 2002/0036304 A1 | 3/2002 | Ehmke et al. | | 2004/0212026 A1 | 10/2004 | Van Brocklin et al. |
| 2002/0054424 A1 | 5/2002 | Miles | | 2004/0217378 A1 | 11/2004 | Martin et al. |
| 2002/0055253 A1 | 5/2002 | Rudhard | | 2004/0217919 A1 | 11/2004 | Pichl et al. |
| 2002/0071169 A1 | 6/2002 | Bowers et al. | | 2004/0218251 A1 | 11/2004 | Piehl et al. |
| 2002/0075555 A1 | 6/2002 | Miles | | 2004/0218334 A1 | 11/2004 | Martin et al. |
| 2002/0086455 A1 | 7/2002 | Franosch et al. | | 2004/0218341 A1 | 11/2004 | Martin et al. |
| 2002/0109899 A1 | 8/2002 | Ohtaka et al. | | 2004/0227493 A1 | 11/2004 | Van Brocklin et al. |
| 2002/0110948 A1 | 8/2002 | Huang et al. | | 2004/0240027 A1 | 12/2004 | Lin et al. |
| 2002/0117728 A1 | 8/2002 | Brosnihan et al. | | 2004/0240032 A1 | 12/2004 | Miles |
| 2002/0126364 A1 | 9/2002 | Miles | | 2004/0240138 A1 | 12/2004 | Martin et al. |
| 2002/0131682 A1 | 9/2002 | Nasiri et al. | | 2004/0245588 A1 | 12/2004 | Nikkel et al. |
| 2002/0135857 A1 | 9/2002 | Fitzpatrick et al. | | 2004/0263944 A1 | 12/2004 | Miles et al. |
| 2002/0137072 A1 | 9/2002 | Mirkin et al. | | 2005/0001828 A1 | 1/2005 | Martin et al. |
| 2002/0149828 A1 | 10/2002 | Miles | | 2005/0003667 A1 | 1/2005 | Lin et al. |
| 2002/0168136 A1 | 11/2002 | Atta et al. | | 2005/0020089 A1 | 1/2005 | Shi et al. |
| 2002/0195681 A1 | 12/2002 | Melendez et al. | | 2005/0024557 A1 | 2/2005 | Lin |
| 2003/0006468 A1 | 1/2003 | Ma et al. | | 2005/0035699 A1 | 2/2005 | Tsai |
| 2003/0036215 A1 | 2/2003 | Reid | | 2005/0036095 A1 | 2/2005 | Yeh et al. |
| 2003/0043157 A1 | 3/2003 | Miles | | 2005/0036192 A1 | 2/2005 | Lin et al. |
| 2003/0054588 A1 | 3/2003 | Patel et al. | | 2005/0038950 A1 | 2/2005 | Adelmann |

| | | | |
|---|---|---|---|
| 2005/0042117 A1 | 2/2005 | Lin | |
| 2005/0046919 A1 | 3/2005 | Taguchi et al. | |
| 2005/0046922 A1 | 3/2005 | Lin et al. | |
| 2005/0046948 A1 | 3/2005 | Lin | |
| 2005/0057442 A1 | 3/2005 | Way | |
| 2005/0068583 A1 | 3/2005 | Gutkowski et al | |
| 2005/0068605 A1 | 3/2005 | Tsai | |
| 2005/0068606 A1 | 3/2005 | Tsai | |
| 2005/0069209 A1 | 3/2005 | Damera-Venkata et al. | |
| 2005/0078348 A1* | 4/2005 | Lin | 359/291 |
| 2005/0128565 A1 | 6/2005 | Ljungblad | |
| 2005/0168849 A1 | 8/2005 | Lin | |
| 2005/0195462 A1 | 9/2005 | Lin | |
| 2005/0195467 A1 | 9/2005 | Kothari et al. | |
| 2005/0202649 A1 | 9/2005 | Hung et al. | |
| 2005/0249966 A1 | 11/2005 | Tung et al. | |
| 2005/0250235 A1 | 11/2005 | Miles et al. | |
| 2006/0006138 A1 | 1/2006 | Lin | |
| 2006/0018348 A1 | 1/2006 | Przybyla et al. | |
| 2006/0066511 A1 | 3/2006 | Chui | |
| 2006/0066932 A1 | 3/2006 | Chui | |
| 2006/0066935 A1 | 3/2006 | Cummings et al. | |
| 2006/0077518 A1 | 4/2006 | Chui et al. | |
| 2007/0019280 A1 | 1/2007 | Sasagawa et al. | |
| 2007/0041703 A1 | 2/2007 | Wang | |
| 2007/0096300 A1 | 5/2007 | Wang et al. | |

FOREIGN PATENT DOCUMENTS

| | | |
|---|---|---|
| CN | 092109265 | 11/2003 |
| DE | 198 47 455 A1 | 4/2000 |
| DE | 10228946 A1 | 1/2004 |
| EP | 0 035 299 | 9/1983 |
| EP | 0173808 | 3/1986 |
| EP | 0 667 548 A1 | 8/1995 |
| EP | 0694801 A | 1/1996 |
| EP | 0695959 | 2/1996 |
| EP | 0878824 A2 | 11/1998 |
| EP | 1197778 | 4/2002 |
| EP | 1258860 A1 | 11/2002 |
| EP | 1 452 481 A | 9/2004 |
| FR | 2824643 | 10/1999 |
| JP | 405275401 A | 10/1993 |
| JP | 10500224 | 1/1998 |
| JP | 10-148644 | 6/1998 |
| JP | 10-267658 | 10/1998 |
| JP | 11211999 A | 8/1999 |
| JP | 11243214 | 9/1999 |
| JP | 2000-40831 A | 2/2000 |
| JP | 2002 062493 | 2/2002 |
| JP | 2002-270575 | 9/2002 |
| JP | 2002-341267 | 11/2002 |
| JP | 2002-355800 | 12/2002 |
| JP | 2003001598 A | 1/2003 |
| JP | 2003-215475 | 7/2003 |
| JP | 2004-102022 A | 4/2004 |
| JP | 2004106074 A | 4/2004 |
| JP | 2004-212656 | 7/2004 |
| JP | 2005051007 A | 2/2005 |
| KR | 2002-9270 | 10/1999 |
| KR | 2000-0033006 | 6/2000 |
| TW | 157313 | 5/1991 |
| WO | WO 92/10925 | 6/1992 |
| WO | WO9530924 | 11/1995 |
| WO | WO9717628 | 5/1997 |
| WO | WO9952006 A2 | 10/1999 |
| WO | WO9952006 A3 | 10/1999 |
| WO | WO0114248 | 3/2001 |
| WO | WO 02/24570 | 3/2002 |
| WO | WO03007049 A1 | 1/2003 |
| WO | WO 03/052506 | 6/2003 |
| WO | WO 03/069413 A | 8/2003 |
| WO | WO03069413 A1 | 8/2003 |
| WO | WO03073151 A1 | 9/2003 |
| WO | WO2004006003 A1 | 1/2004 |
| WO | WO2004026757 A2 | 4/2004 |
| WO | WO 2005/019899 A1 | 3/2005 |
| WO | WO 2005/085932 A | 9/2005 |
| WO | WO 2006/036385 | 4/2006 |
| WO | WO 2006/036437 | 4/2006 |
| WO | WO 2006/036542 | 4/2006 |

OTHER PUBLICATIONS

Akasaka, "Three-Dimensional IC Trends," Proceedings of IEEE, vol. 74, No. 12, pp. 1703-1714, (Dec. 1986).

Austrian Search Report dated May 4, 2005.

Austrian Search Report dated Aug. 12, 2005.

Aratani et al., "Surface micromachined tuneable interferometer array," Sensors and Actuators, pp. 17-23. (1994).

Conner, "Hybrid Color Display Using Optical Interference Filter Array," SID Digest, pp. 577-580 (1993).

Fan et al., "Channel Drop Filters in Photonic Crystals," Optics Express, vol. 3, No. 1 (1998).

Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).

Goossen et al., "Possible Display Applications of the Silicon Mechanical Anti-Reflection Switch," Society for Information Display (1994).

Goossen et al., "Silicon Modulator Based on Mechanically-Active Anti-Reflection Layer with 1Mbit/sec Capability for Fiber-in-the-Loop Applications," IEEE Photonics Technology Letters, pp. 1119,. 1121 (Sep. 1994).

Goossen K.W., "MEMS-Based Variable Optical Interference Devices", Optical MEMS, 2000 IEEE/Leos International Conference on Aug. 21-24, 2000, Piscataway, NJ, USA, IEE, Aug. 21, 2000, pp. 17-18.

Gosch, "West Germany Grabs the Lead in X-Ray Lithography," Electronics pp. 78-80 (Feb. 5, 1987).

Harnett et al., "Heat-depolymerizable polycarbonates as electron beam patternable sacrificial layers for nanofluidics," J. Vac. Sci. Technol. B 19(6), (Nov./Dec. 2001), pp. 2842-2845.

Howard et al., "Nanometer-Scale Fabrication Techniques," VLSI Electronics: Microstructure Science, vol. 5, pp. 145-153 and pp. 166-173 (1982).

Ibbotson et al., "Comparison of XeF2 and F-atom reactions with Si and SiO2," Applied Physics Letters, vol. 44, No. 12, pp. 1129-1131 (Jun. 1984).

Jackson "Classical Electrodynamics," John Wiley & Sons Inc., pp. 568-573. (date unknown).

Jerman et al., "A Miniature Fabry-Perot Interferometer with a Corrugated Silicon Diaphragm Support," (1988).

Joannopoulos et al., "Photonic Crystals: Molding the Flow of Light," Princeton University Press (1995).

Johnson, "Optical Scanners," Microwave Scanning Antennas, vol. 1, p. 251-261, (1964).

Kim et al., "Control of Optical Transmission Through Metals Perforated With Subwavelength Hole Arrays," Optic Letters, vol. 24, No. 4, pp. 256-257, (Feb. 1999).

Lee et al., "Electrostatic Actuation of Surface/Bulk Micromachined Single-Crystal Silicon Microresonators", International Conference on Intelligent Robots and Systems, vol. 2, pp. 1057-1062, (Oct. 17-21, 1999).

Lee et al., "The Surface/Bulk Micromachining (SBM) Process: A New Method for Fabricating Released MEMS in Single Crystal Silicon", Journal of Microelectromechanical Systems, Vol. 8, Issue 4, pp. 409-416, (Dec. 1999).

Light over Matter, Circle No. 36 (Jun. 1993).

Lin et al., "Free-Space Micromachined Optical Switches for Optical Networking," IEEE Journal of Selected Topics in Quantum Electronics, vol. 5, No. 1, pp. 4-9. (Jan./Feb. 1999).

Little et al., "Vertically Coupled Microring Resonator Channel Dropping Filter," IEEE Photonics Technology Letters, vol. 11, No. 2, (1999).

Magel, "Integrated Optic Devices Using Micromachined Metal Membranes," SPIE vol. 2686, 0-8194-2060-Mar. (1996).

Miles, Mark, W., "A New Reflective FPD Technology Using Interferometric Modulation," The Proceedings of the Society for Information Display (May 11-16, 1997).

Nagami et al., "Plastic Cell Architecture: Towards Reconfigurable Computing For General-Purpose," IEEE, 0-8186-8900-, pp. 68-77, (May 1998).

Newsbreaks, "Quantum-trench devices might operate at terahertz frequencies," Laser Focus World (May 1993).

Oliner et al., "Radiating Elements and Mutual Coupling," Microwave Scanning Antennas, vol. 2, pp. 131-141, (1966).

PCT/US02/13442, Search Report Sep. 13, 2002.

PCT/US04/20330 Search Report Nov. 8, 2004.

PCT/US05/029821 International Search Report (Dec. 27, 2005).

PCT/US05/030927 International Search Report (Jan. 25, 2006).

PCT/US05/031693 International Search Report.

PCT/US05/032231 International Search Report (Apr. 7, 2006).

PCT/US05/033558 Partial International Search Report (Feb. 24, 2006).

PCT/US2004/035820 International Search Report and Written Opinion (Apr. 11, 2005).

PCT/US96/17731 Search Report.

Raley et al., "A Fabry-Perot Microinterferometer for Visible Wavelengths," IEEE Solid-State Sensor and Actuator Workshop, Jun. 1992, Hilton Head, SC.

Schnakenberg et al., "TMAHW Etchants for Silicon Micromachining," 1991 International Conference on Solid State Sensors and Actuators-Digest of Technical Papers, pp. 815-818 (1991).

Sperger et al., "High Performance Patterned All-Dielectric Interference Colour Filter for Display Applications," SID Digest, pp. 81-83, (1994).

Sridharan et al. "Post-Packaging Release a New Concept for Surface-Micromachined Devices" Technical Digest, IEEE Solid-State Sensor & Actuator Workshop, New York, NY, US, Nov. 8, 1998, pp. 225-228, XP000992464.

Stone, "Radiation and Optics, An Introduction to the Classical Theory," McGraw-Hill, pp. 340-343, (1963).

Walker et al., "Electron-beam-tunable Interference Filter Spatial Light Modulator," Optics Letters vol. 13, No. 5, pp. 345-347, (May 1988).

Williams et al., "Etch Rates for Micromachining Processing," Journal of Microelectromechanical Systems, vol. 5, No. 4, pp. 256-259 (Dec. 1996).

Winters et al., "The etching of silicon with XeF2 vapor. Applied Physics Letters," vol. 34, No. 1, pp. 70-73 (Jan. 1979).

Winton, "A novel way to capture solar energy," Chemical Week, (May 1985).

Wu, "Design of a Reflective Color LCD Using Optical Interference Reflectors," ASIA Display '95, pp. 929-931, (Oct. 1995).

Zhou et al., "Waveguide Panel Display Using Electromechanical Spatial Modulators" SID Digest, vol. XXIX, (1998).

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).

Austrian Search Report for EX72/2005 dated May 13, 2005.

Austrian Search Report for EX81/2005 dated May 18, 2005.

Austrian Search Report for EX170/2005 dated Jul. 6, 2005.

Austrian Search Report for EX139/2005 dated Jul. 27, 2005.

Austrian Search Report for EX144/2005 dated Aug. 11, 2005.

Bains, "Digital Paper Display Technology Holds Promise For Portables," CommsDesign EE Times (2000).

Bass, Handbook of Optics, vol. 1, Fundamentals, Techniques, and Design, Second Edition, McGraw-Hill, inc. New York pp. 2.29/2.36 (1995).

Chu, et al. "Formation and Microstructures of Anodic Aluminoa Films from Aluminum Sputtered onglass Substrate" Journal of the Electrochemical Society, 149 (7) B321-B327 (2002).

Crouse, "Self-ordered pore structure of anodized aluminum on silicon and pattern transfer" Applied Physics Letters, vol. 76, No. 1, Jan. 3, 2000. pp. 49-51.

French, P.J. "Development of Surface Micromachining techniques compatable with on-chip electronics" Journal of Micromechanics and Microengineering vol. 6 No. 2, 197-211 XP 002360789 Jun. (1996) IOP Publishing.

Furneaux, et al. "The Formation of Controlled-porosity membranes from Anodically Oxidized Aluminium" Nature vo 337 Jan. 12, 1989, pp. 147-149.

Jerman J. H. et al., "Maniature Fabry-Perot Interferometers Micromachined in Silicon for Use in Optical Fiber WDM Systems," Transducers. San Francisco, Jun. 24-27, 1991, Proceedings of the International Conference on Solid State Sensors Andactuators, New Youk IEEE, US, vol. Conf. 6, Jun. 24, 1991.

Lieberman, "MEMS Display Looks to Give PDAs Sharper Image," EE Times (Feb. 11, 1997).

Lieberman, "Microbridges at Heart of New MEMS Displays," EE Times (Apr. 24, 1997).

Maboudian, et al. Critical Review: Adhesion in Surface Micromechanical Structures: J. Vac. Sci Techno. B 15(1) Jan./Feb. 1997, pp. 1-20.

Microchem, LOR Lift-Off Resists Datasheet, 2002.

Miles, "Interferometric Modulation: MOEMS as an Enabling Technology for High-Performance Reflective Displays," Proceedings of the International Society for Optical Engineering, San Jose, CA, vol. 49085, pp. 131-139 (Jan. 28, 2003).

Miles, et al., "10.1: Digital Paper for Reflective Displays," 2002 SID International Symposium Digest of Technical Papers, Boston, MA, SID International Symposium Digest of Technical Papers, San Jose, CA, vol. 33 / 1, pp. 115-117 (May 21-23, 2002).

Penta Vacuum MEMS Etcher Specifications, http://www.pentavacuum.com/memes.htm.

Science and Technology, The Economist, pp. 89-90, (May 1999).

Search Report PCT/US05/030033 and Written Opinion.

Search Report PCT/US05/030902.

Search Report and Written Opinion for PCT/US05/33558 (May 19, 2005).

Search Report PCT/US05/032331 (Apr. 7, 2006).

Search Report PCT/US05/032331 (Jan. 9, 2006).

Search Report and written opinion PCT/US05/032647.

Tayebi et al. "Reducing the Effects of adhesion and friction in microelectomechanical systesm (MEMS) through surface roughening: Comparision Between theory and experiments" http://jap.ajp.org/jap/copyright.isp Journal of applied Physics 98, 073528 (2005).

Thin Film Transistors- Materials and Processes -vol. 1 Amorphous Silicon Thin Film Transistors ed. Yue Kuo, Kluwer Academic Publishers, Boston (2004).

Xactix Xetch X Specifications, http://xactix.com/Xtech X3specs.htm. Jan. 5, 2005.

Xactix Xetch Product information.

International Search Report and Written Opinion, International Appln. No. PCT/US2007/000698, mailed Aug. 8, 2007.

* cited by examiner

|  | Column Output Signals | |
|---|---|---|
|  | $+V_{bias}$ | $-V_{bias}$ |
| 0 | Stable | Stable |
| $+\Delta V$ | Relax | Actuate |
| $-\Delta V$ | Actuate | Relax |

Row Output Signals

SILICON-RICH SILICON NITRIDES AS ETCH STOPS IN MEMS MANUFACTURE

FIELD OF THE INVENTION

Microelectromechanical systems (MEMS) include micromechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

One embodiment disclosed herein includes an unreleased MEMS device, comprising a silicon nitride layer positioned between a sacrificial layer and an electrode layer, wherein the electrode layer is adapted to be movable upon removal of the sacrificial layer and the ratio of silicon to nitrogen in the silicon nitride layer is greater than 3:4.

Another embodiment disclosed herein includes an unreleased interferometric modulator, comprising an etch stop layer positioned between a sacrificial layer and a metal mirror layer, wherein the metal mirror layer is adapted to be movable upon removal of the sacrificial layer and the etch stop layer is adapted to be substantially completely removed upon exposure to $XeF_2$ for less than about 10 minutes.

Another embodiment disclosed herein includes an unreleased MEMS device, comprising a silicon nitride layer positioned between a sacrificial layer and an electrode layer, wherein the electrode layer is adapted to be movable upon removal of the sacrificial layer, the silicon nitride layer is adapted to be substantially completely removed upon exposure to a first etchant that is adapted to substantially completely remove the sacrificial layer, and the silicon nitride layer is adapted to be substantially resistant to a second etchant that is adapted to substantially completely remove the electrode layer.

Another embodiment disclosed herein includes an unreleased interferometric modulator, comprising means for reflecting light, means for supporting the reflecting means during interferometric modulator manufacture, and means for protecting the supporting means during etching of the reflecting means.

Another embodiment disclosed herein includes a method of manufacturing a MEMS device, comprising forming a sacrificial layer, forming an electrode layer, wherein the electrode layer is adapted to be movable upon removal of the sacrificial layer, forming a silicon nitride layer between the sacrificial layer and the electrode layer, wherein the ratio of silicon to nitrogen in the silicon nitride layer is greater than about 3:4, patterning the electrode layer, and removing the sacrificial layer.

Another embodiment disclosed herein includes a method of manufacturing a MEMS device, comprising forming a sacrificial layer, forming an electrode layer, wherein the electrode layer is adapted to be movable upon removal of the sacrificial layer, forming an etch stop layer between the sacrificial layer and the electrode layer, patterning the electrode layer, and removing the sacrificial layer and etch stop layer with a same etchant.

DETAILED DESCRIPTION OF THE PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

An embodiment provides a method for making an interferometric modulator that involves the use of an etch stop between an upper electrode or reflective layer and a sacrificial layer. The etch stop can be used to reduce undesirable over-etching of the sacrificial layer and the upper electrode or mirror layer. The etch stop layer may also serve as a barrier layer, buffer layer, and/or template layer. The etch stop layer is advantageously silicon-rich silicon nitride, which can be cleanly removed simultaneously with removal of the sacrificial layer.

Figure 1:
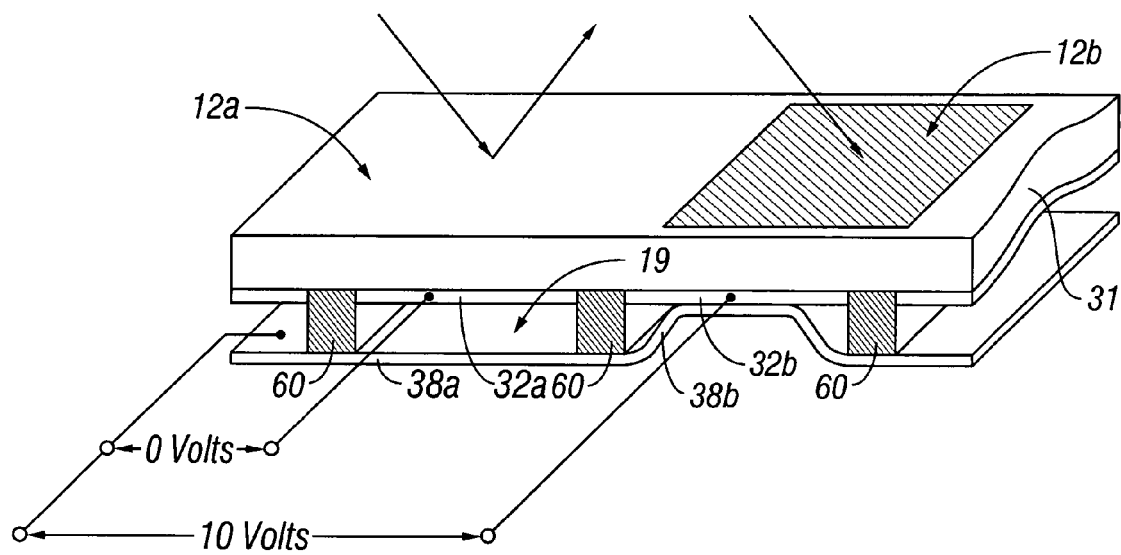
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this FIG.) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
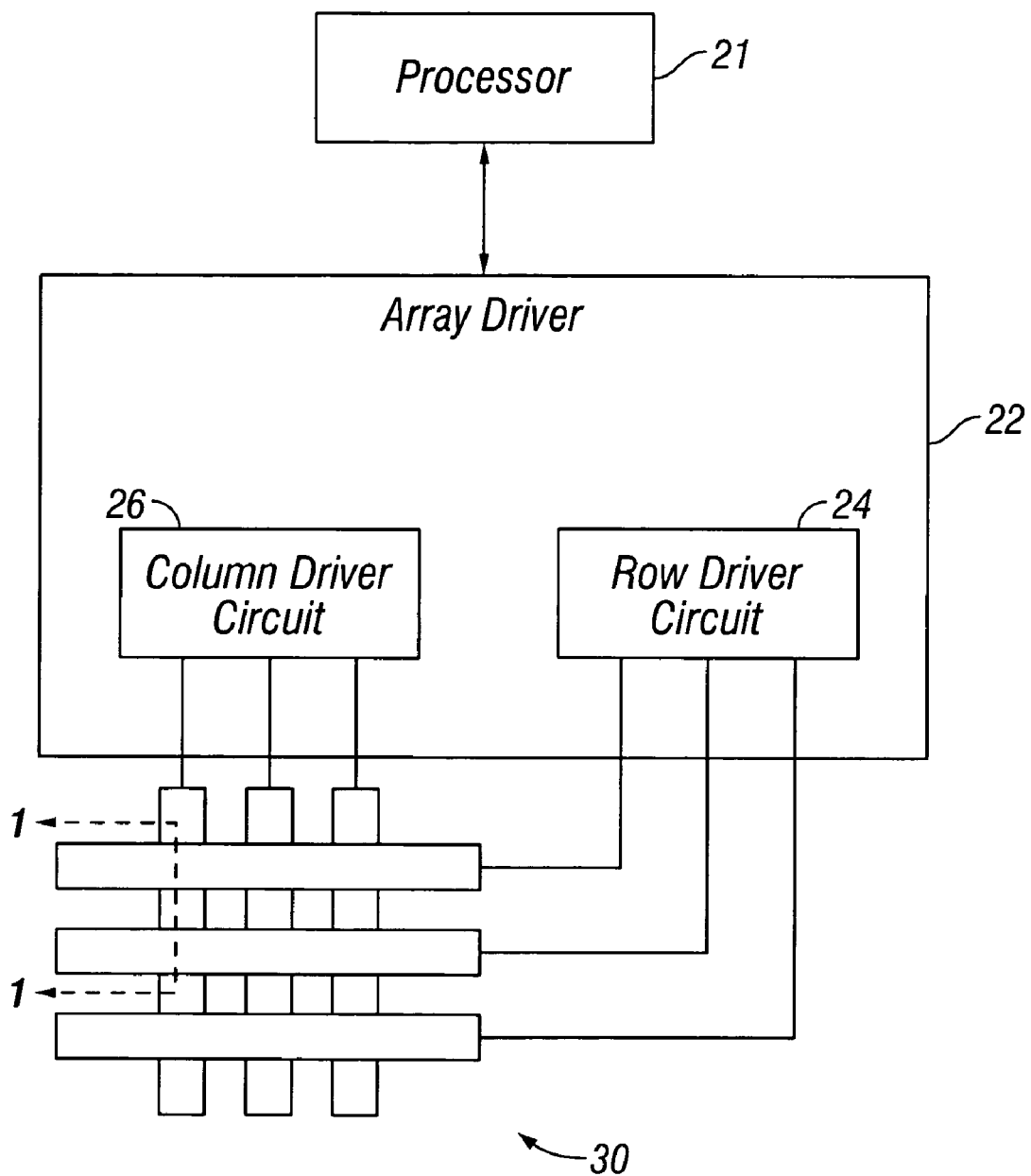
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
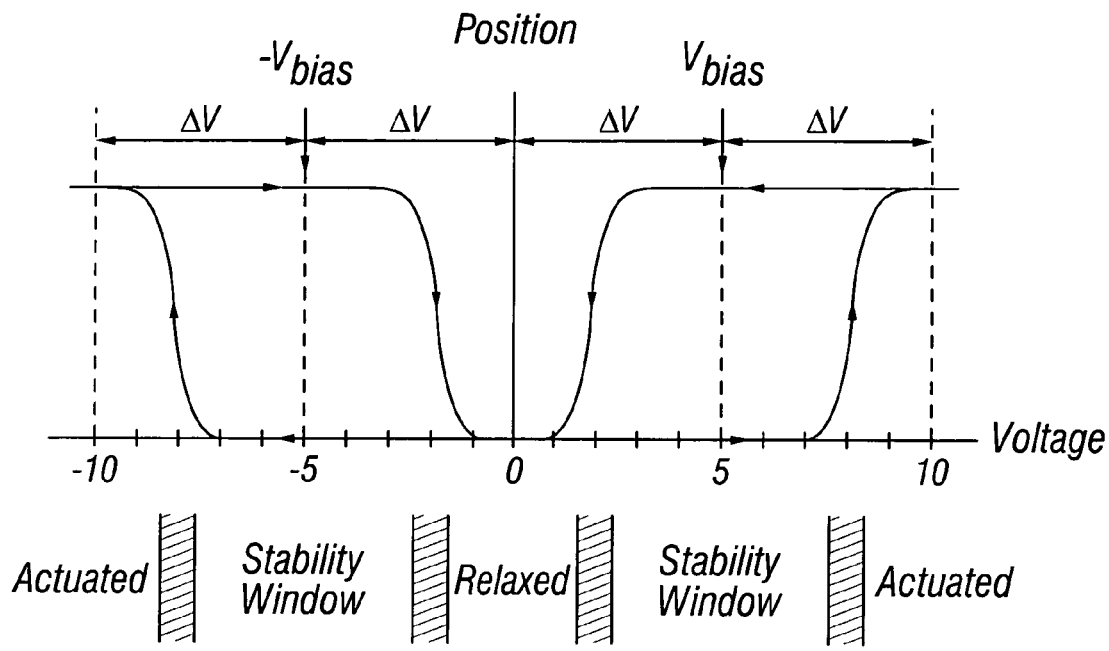
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
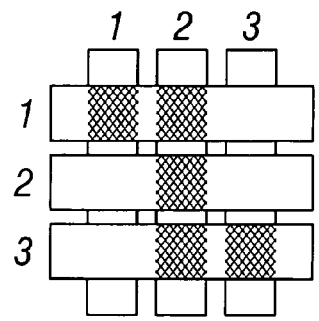
FIGS. 5A and 5B illustrate one exemplary timing diagram for row and column signals that may be used to write a frame of display data to the 3×3 interferometric modulator display of FIG. 2.
Figure 5B:
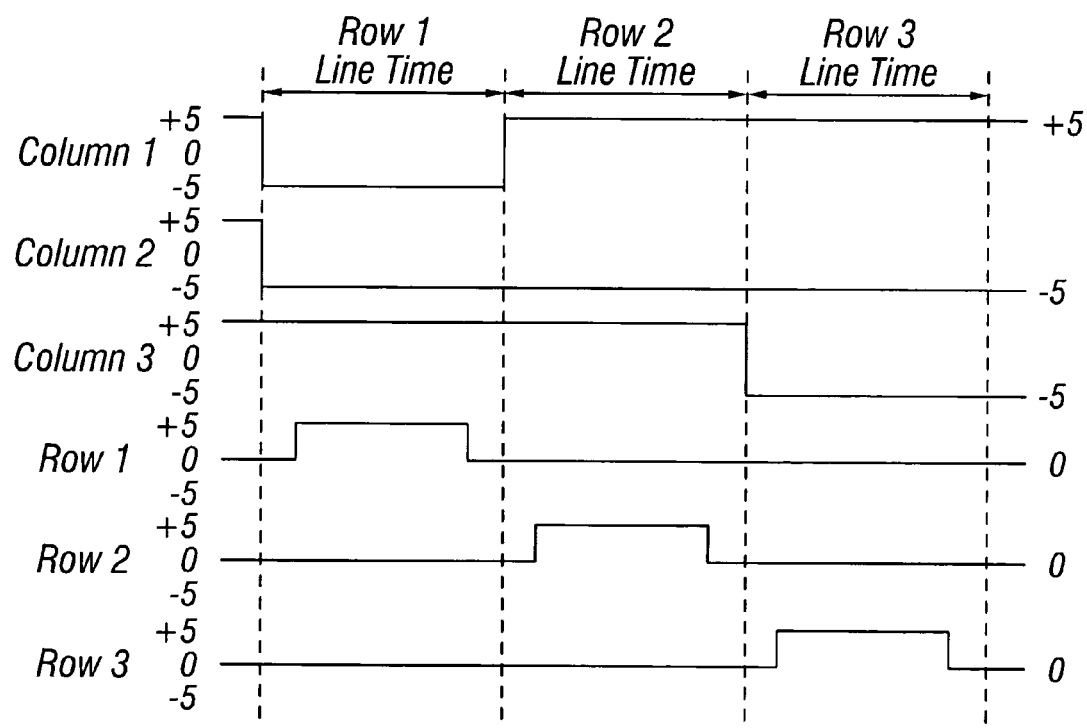

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to $-5$ volts and $+5$ volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to $-V_{bias}$, and the appropriate row to the same $-\Delta V$, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
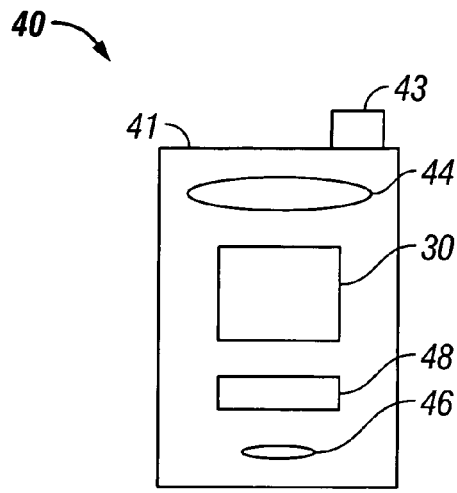
FIGS. 6A and 6B are system block diagrams illustrating an embodiment of a visual display device comprising a plurality of interferometric modulators.
Figure 6B:
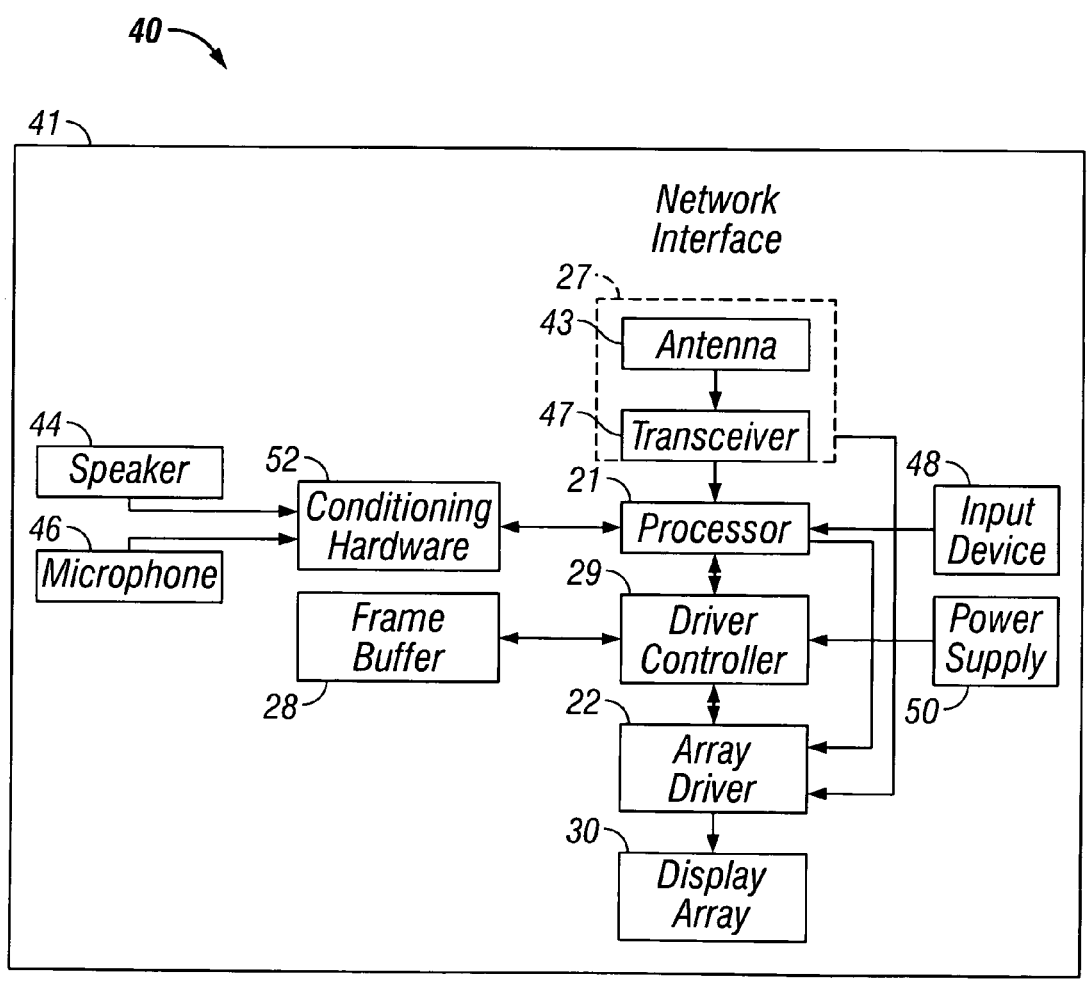

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 44, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of the exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more devices over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, the network interface 27 can be replaced by an image source, which can store or generate image data to be sent to the processor 21. For example, the image source can be a digital video disc (DVD) or a hard-disc drive that contains image data, or a software module that generates image data.

The processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to the frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. The conditioning hardware 52 generally includes amplifiers and filters for transmitting signals to the speaker 45, and for receiving signals from the microphone 46. The conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, the driver controller 29 is a conventional display controller or a bi-stable display controller (e.g., an interferometric modulator controller). In another embodiment, the array driver 22 is a conventional driver or a bi-stable display driver (e.g., an interferometric modulator display). In one embodiment, the driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, the input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

The power supply 50 can include a variety of energy storage devices as are well known in the art. For example, in one embodiment, the power supply 50 is a rechargeable battery, such as a nickel-cadmium battery or a lithium ion battery. In another embodiment, the power supply 50 is a renewable energy source, a capacitor, or a solar cell, including a plastic solar cell, and solar-cell paint. In another embodiment, the power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
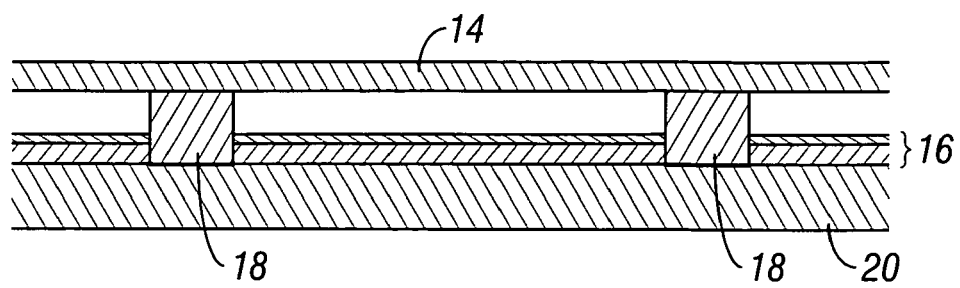
FIG. 7A is a cross section of the device of FIG. 1
Figure 7B:
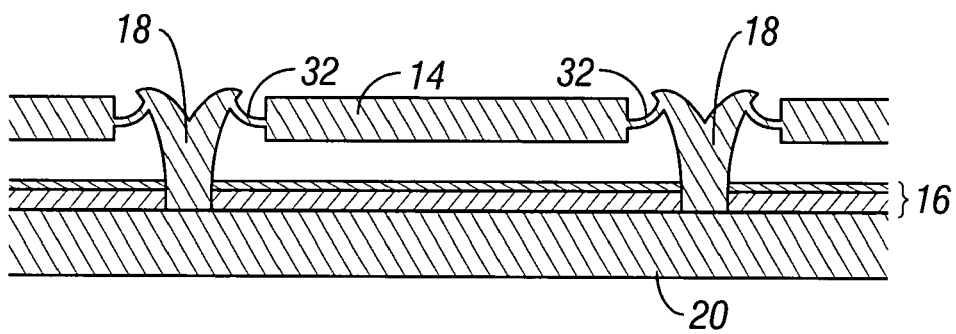
FIG. 7B is a cross section of an alternative embodiment of an interferometric modulator.
Figure 7C:
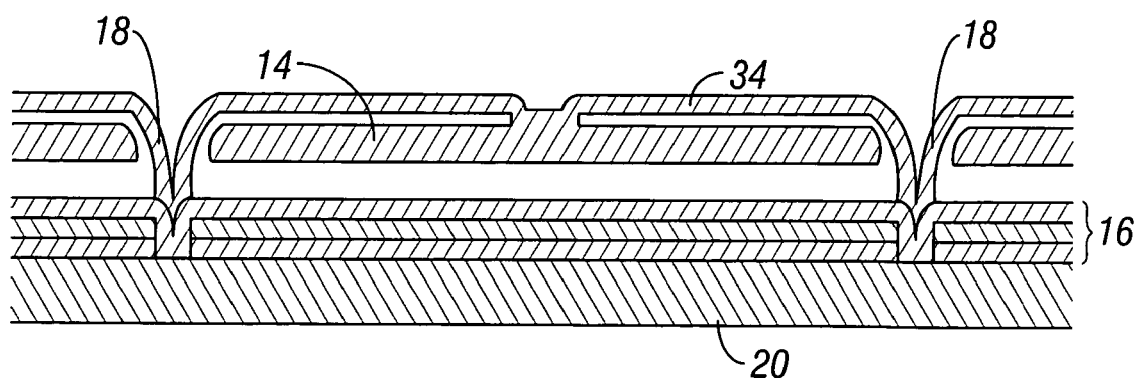
FIG. 7C is a cross section of another alternative embodiment of an interferometric modulator.
Figure 7D:
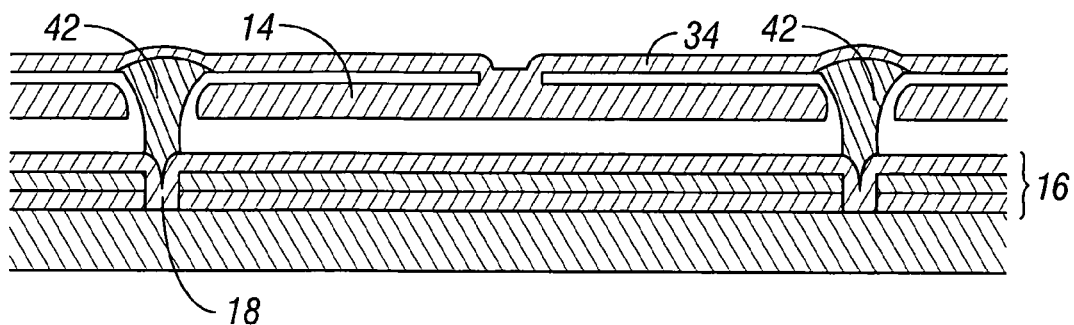
FIG. 7D is a cross section of yet another alternative embodiment of an interferometric modulator.
Figure 7E:
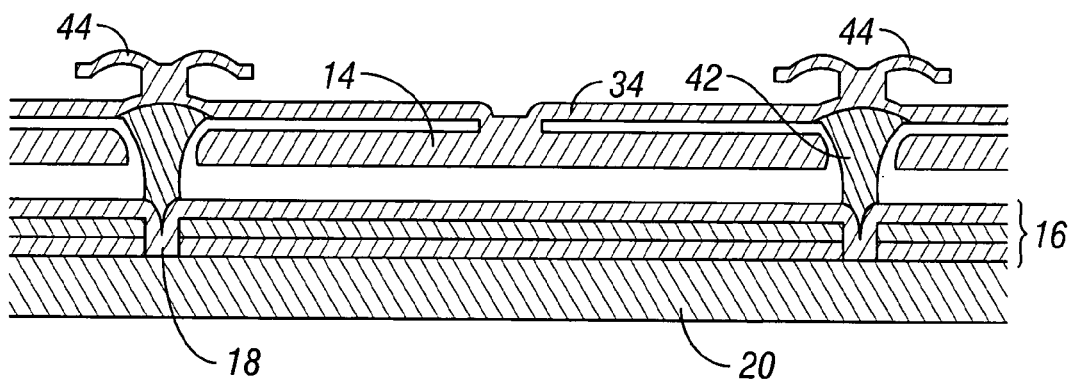
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on. orthogonally extending supports 18. In FIG. 7B, the moveable reflective layer 14 is attached to supports 18 at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. The connections are herein referred to as supports or posts 18. The embodiment illustrated in FIG. 7D has supports 18 including support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIGS. 7A-7E, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from the mechanical properties of the modulator, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

As mentioned above, interferometric modulators, such as those depicted in FIGS. 7A-7E, may be manufactured by using a sacrificial layer to define the air gaps. As a last step of manufacture, the sacrificial layer may be removed by etching (herein referred to as "releasing" an interferometric modulator). Suitable materials for the sacrificial layer include, but are not limited to, molybdenum, germanium, tungsten, and amorphous silicon.

Figure 8:
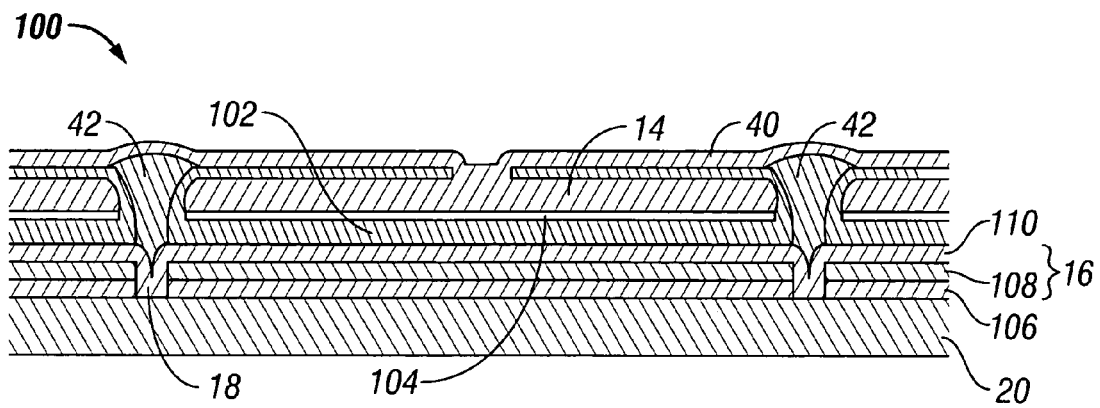
FIG. 8 is a cross section of an embodiment of an unreleased interferometric modulator.

FIG. 8 is a cross-sectional view illustrating an embodiment of an unreleased interferometric modulator 100 comprising a sacrificial layer 102, an upper reflective layer 14 over the sacrificial layer 102, and an etch stop layer 104 between the sacrificial layer 102 and the upper reflective layer 14. A similar structure may be used for other MEMS devices where upper reflective layer 14 is generally an electrode layer that is preferably movable upon removal of the sacrificial layer 102. The unreleased interferometric modulator 100 corresponds to the released interferometric modulator depicted in FIG. 7D (i.e., the interferometric modulator of FIG. 7D is formed after release etch(es) to remove the sacrifical layer 102 and the etch stop layer 104). The etch stop layer 104 may be used to protect the sacrificial layer 102 during patterning of the reflective layer 14. For example, when the reflective layer 14 is aluminum and the sacrificial layer 102 is molybdenum, the etchant used to pattern the reflective layer 14 (e.g., a PAN etchant) may also partially etch the underlying sacrificial layer 102 unless the etch stop layer 104 is included. The skilled artisan will appreciate that this problem will also exist with other combinations of materials and etchants.

In one embodiment, the thickness of the etch stop layer 104 may be in the range of about 100 Å to about 700 Å. In some embodiments, the thickness of the etch stop layer 104 is in the range of about 300 Å to about 700 Å. Etch stop layers 104 consisting of $SiO_2$ or titanium may be used, for example, as discussed more fully in co-pending U.S. application Ser. No. 11/090,773, filed Mar. 25, 2005, which is incorporated herein by reference in its entirety. However, $SiO_2$ is not completely removed by the $XeF_2$ used to remove the sacrificial layer 102, leaving undesired residue on the reflective layer 14. Use of titanium tends to distort the flatness of an aluminum reflective layer 14. Accordingly, there is a need for improved etch stop layer materials. As described more fully herein, it has been surprisingly found that silicon-rich silicon nitrides provide good etch stop functionality as well as being well removed by the $XeF_2$ etchant used to remove the sacrificial layer 102. Thus, in some embodiments, the etch stop layer 104 comprises a silicon-rich silicon nitride. In some embodiments, the silicon-rich silicon nitride etch stop layer 104 may be removed during the release etch that removes the sacrificial layer.

As used herein "silicon-rich silicon nitride" refers to any silicon nitride material that has a ratio of silicon to nitrogen greater than the typical stoichiometric silicon nitride ratio of about 3:4. The silicon-rich silicon nitride etch stop layer can be formed by chemical vapor deposition (e.g., at low temperature by plasma enhanced chemical vapor deposition) or any other suitable means. In some embodiments, the silicon-rich silicon nitride has a silicon to nitrogen ratio of greater than about 1:1. Preferably, silicon nitride films are provided that have a refractive index of greater than about 2.1. More preferably, silicon nitride films are provided that have a refractive index of greater than about 2.2.

In the illustrated embodiment, the upper reflective layer 14 (or other movable electrode layer for MEMS devices other than interferometric modulators) may be aluminum. In other embodiments, the upper reflective layer 14 may be a material that comprises aluminum and thus may be an aluminum alloy such as, for example, Al—Si, Al—Cu, Al—Ti, or Al—Nd. The sacrificial layer 102 comprises molybdenum in the illustrated embodiment. Other suitable sacrificial materials include, but are not limited to, amorphous silicon ("a—Si"), germanium, and tungsten. In some embodiments, the etch stop layer 104 also acts as a diffusion barrier to prevent interdiffusion between the material in the sacrificial layer 102 and the upper reflective layer 14. For example, where the sacrificial layer 102 is amorphous silicon and the upper reflective layer 14 is aluminum, an etch stop layer 104 of. silicon-rich silicon nitride will prevent interdiffusion between the aluminum in the upper reflective layer 14 and the silicon in the sacrificial layer 102. In some embodiments, the materials used for the fabrication of the sacrificial layer 102, the reflective layer 14, and the etch stop layer 104 are selected in combination with one another to bring about certain desired effects such as etch selectivity, resistance to diffusion (diffusion barrier), barrier to crystallographic influence, and crystallographic templating, as described in greater detail below.

The upper reflective layer 14 and etch stop layer 104 are spaced from a glass substrate 20 by posts 18, which in the illustrated embodiment include support plugs 42. In other embodiments, the upper reflective layer 14 may be supported by other structures, including side walls, such as for example is depicted in FIG. 7C. The unreleased interferometric modulator 100 also includes a transparent electrode layer 106 over the glass substrate 20. The electrode layer 106 may comprise a transparent metal film such as indium tin oxide (ITO) or zinc tin oxide (ZTO). A lower reflective layer 108 (such as chrome or molybdenum) and a dielectric layer 110 (such as a $SiO_2$ or a composite layer comprising a layer of $Sio_2$ and a layer of $Al_2O_3$) are formed over the electrode layer 106. The electrode layer 106, lower reflective layer 108, and dielectric layer 110 may together be referred to as an optical stack 16 that partially transmits and partially reflects light. It will be appreciated that the etch stop layer 104 may be included in other unreleased interferometric modulator configurations, e.g., any of the configurations resulting in the interferometric modulators illustrated in FIGS. 7A-7E.

It has been found that the presence of an etch stop layer between the upper reflective layer and the sacrificial layer (such as the etch stop layer 104 between the sacrificial layer 102 and the reflective layer 14) may significantly improve one or more aspects of various processes for making interferometric modulators (including arrays thereof), and/or may improve one or more qualities of the resulting interferometric modulators themselves. For example, the etch stop layer 104 may comprise or serve as an etch stop as described below with reference to FIGS. 9A-10H in the context of making an array of interferometric modulators of the general type illustrated in FIG. 7D.

In view of the illustrated embodiments, those skilled in the art will understand that similar etch stop layers may be used to manufacture other MEMS devices, including interferometric modulators of the general types illustrated in FIGS. 7A-7E, as well as other types of spatial light modulators. In general, the etch stop layer may be used between a layer used to define a cavity (e.g., sacrificial layer 102c) and a structure adjacent to the cavity (e.g., a movable electrode such as reflective layer 14) in any MEMS device. Thus, while the process described below with respect to FIGS. 9A-10H may refer to particular steps, sequences, and materials, it is understood that such details are for the purpose of illustration, and that other steps, sequences and/or materials may be used.

FIGS. 9A-9E are cross-sectional views illustrating the initial steps in a process for manufacturing an array of unreleased interferometric modulators (release by removal of the sacrificial material to form interferometric modulators is discussed below with reference to FIGS. 10A-10H). In FIGS. 9A-10H, the formation of an array of three interferometric modulators 200 (red subpixel), 202 (green subpixel), and 204 (blue subpixel) are illustrated. Each of the interferometric modulators 200, 202, and 204 have a different distance between the lower reflective layer 108 and the upper reflective layer 14 as indicated in FIG. 10H, which shows final configurations. Color displays may be formed by using three (or more) modulator elements to form each pixel in the resulting image. The dimensions of each interferometric modulator cavity (e.g., the cavities 206, 208, and 210 in FIG. 10H) determine the nature of the interference and the resulting color. One method of forming color pixels is to construct arrays of interferometric modulators, each having cavities of differing sizes, e.g., three different sizes corresponding to red, green and blue as shown in this embodiment. The interference properties of the cavities are directly affected by their dimensions. In order to create these varying cavity dimensions, multiple sacrificial layer thicknesses may be fabricated as described below so that the resulting pixels reflect light corresponding to each of the three primary colors. Other color combinations are also possible, as well as the use of black and white pixels.

Figure 9A:
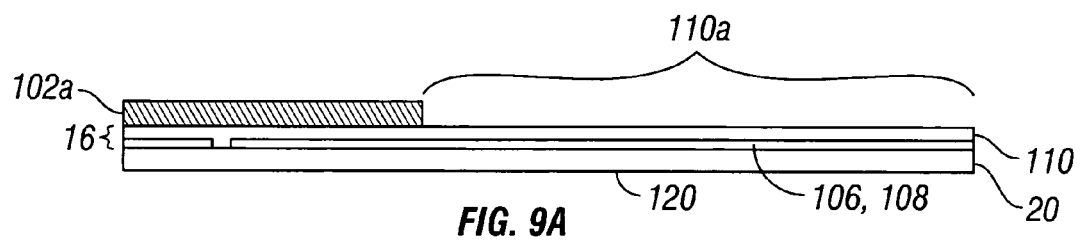
FIGS. 9A-9E are cross-sections illustrating the initial process steps in an embodiment of a method for making an array of interferometric modulators.

FIG. 9A illustrates an optical stack 16 formed by depositing an indium tin oxide electrode layer 106 on a transparent substrate 20 and then depositing a first reflective layer 108 on the electrode layer 106. In the illustrated embodiment, the first reflective layer 108 comprises chrome. Other reflective metals such as molybdenum and titanium may also be used to form the first reflective layer 108. In FIGS. 9A-10H, although the electrode layer 106 and the first reflective layer 108 are indicated as a single layer 106, 108, it is understood that for an interferometric modulator embodiment, the first reflective layer 108 is formed on the electrode layer 106 as illustrated in FIG. 8. In other MEMS devices, only a single electrode layer may be required. The viewing surface 120 of the transparent substrate 20 is on the opposite side of the substrate 20 from the first reflective layer 108 and the electrode layer 106. In a process not shown here, the electrode and first reflective layers 106, 108 are patterned and etched to form electrode columns, rows, or other useful shapes as required by the display design. As indicated in FIG. 9A, the optical stack 16 also includes an oxide dielectric layer 110 over the reflective layer 108, typically formed after the electrode and first reflective layers 106, 108 have been patterned and etched.

FIG. 9A further illustrates a first subpixel sacrificial layer 102a formed by depositing molybdenum over the optical stack 16 (and thus over the oxide dielectric layer 110, first reflective layer 108, and electrode layer 106). The molybdenum is etched to form the first pixel sacrificial layer 102a, thereby exposing a portion 110a of the oxide dielectric layer 110 that is the region where the resulting green and blue interferometric modulators 202 and 204 are formed (FIG. 10H). The thickness of the first sacrificial layer 102a (along with the thicknesses of subsequently deposited layers as described below) influences the size of the corresponding cavity 206 in the resulting red interferometric modulator 200 (FIG. 10H).

Figure 9B:
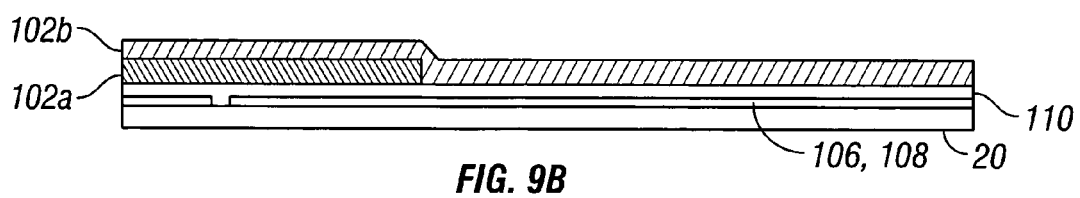
Figure 9C:
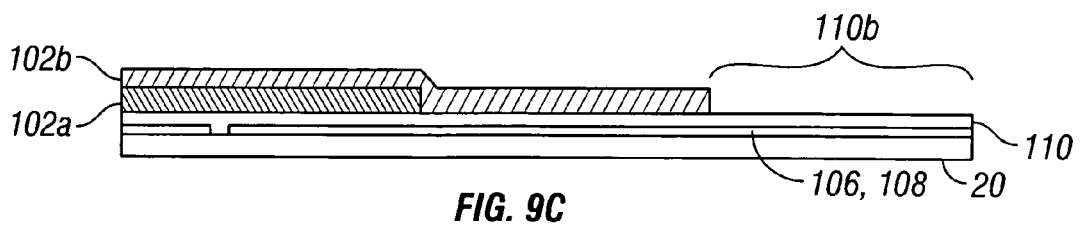

FIGS. 9B-9C illustrate forming a second subpixel sacrificial layer 102b by deposition, masking, and patterning over the exposed portion 110a of the oxide dielectric layer 110 and the first subpixel sacrificial layer 102a. The second subpixel sacrificial layer 102b preferably comprises the same sacrificial material as the first subpixel sacrificial layer 102a (molybdenum in this embodiment). The second subpixel sacrificial layer 102b is patterned and etched as illustrated in FIG. 9C to expose a portion 110b of the oxide dielectric layer 110 in the region where the resulting blue interferometric modulator 204 will be formed (FIG. 10H).

Figure 9D:
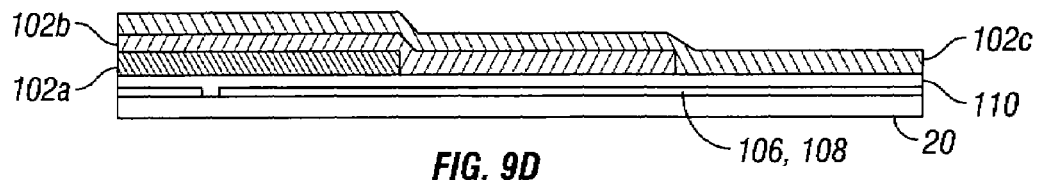

A third subpixel sacrificial layer 102c is then deposited over the exposed portion 110b of the oxide dielectric layer 110 and the second subpixel sacrificial layer 102b as illustrated in FIG. 9D. The third subpixel sacrificial layer 102c need not be patterned or etched in this embodiment, since its thickness will influence the sizes of all three cavities 206, 208, and 210 in the resulting interferometric modulators 200, 202, and 204 (FIG. 10H). The three deposited subpixel sacrificial layers 102a, 102b, and 102c do not necessarily have the same thickness. In the illustrated embodiment, the thicknesses of the sacrificial layers 102a, 102b, and 102c cumulatively define the air gap 206 of the red subpixel 200 (FIG. 10H). The thicknesses of the sacrificial layers 102b and 102c cumulatively define the air gap 208 of the green subpixel 202 (FIG. 10H). The thickness of the sacrificial layer 102c defines the air gap 210 of the blue subpixel 204 (FIG. 10H).

Figure 9E:
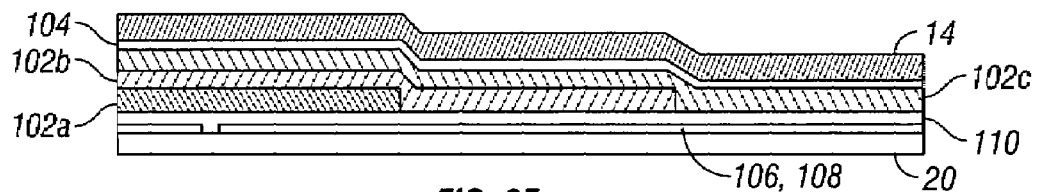

FIG. 9E illustrates forming an etch stop layer 104 by depositing silicon-rich silicon nitride as described above over the third subpixel sacrificial layer 102c, followed by depositing a second reflective layer 14 (e.g., an aluminum-containing metal) over the etch stop layer 104. In the illustrated embodiment, the second reflective layer 14 also serves as an electrode. The second reflective layer 14 is preferably deposited immediately or very soon after the etch stop layer 104 is deposited. In one embodiment, the second reflective layer 14 is deposited over the etch stop layer 104 immediately after depositing the etch stop layer 104, preferably in the same deposition chamber and without breaking a vacuum, resulting in reduced oxidation of the surface of the second reflective layer 14. The thickness of the etch stop layer 104 may be in the range of about 100 Å to about 700 Å, preferably in the range of about 100 Å to about 300 Å. For embodiments in which the etch stop layer 104 is also a diffusion barrier, the thickness of the etch step layer is preferably in the range of from about 300 Å to about 700 Å. Although the foregoing description refers to certain exemplary materials for the fabrication of the various layers illustrated in FIGS. 9A-10H, it will be understood that other materials may also be used, e.g., as described above with reference to FIG. 8.

Figure 10A:
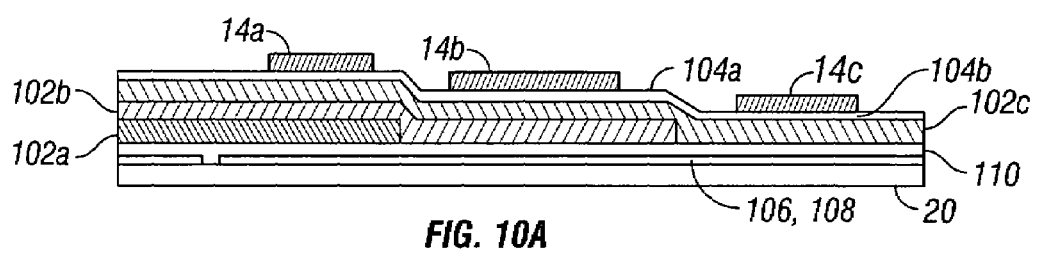
FIGS. 10A-10H are cross-sections illustrating the later process steps in the embodiment of a method for making an array of interferometric modulators.
Figure 10B:
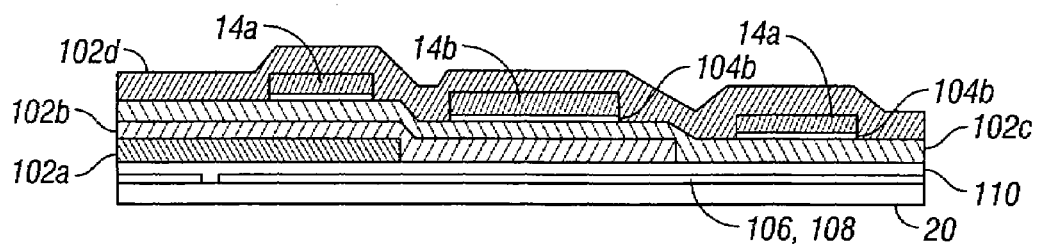
Figure 10C:
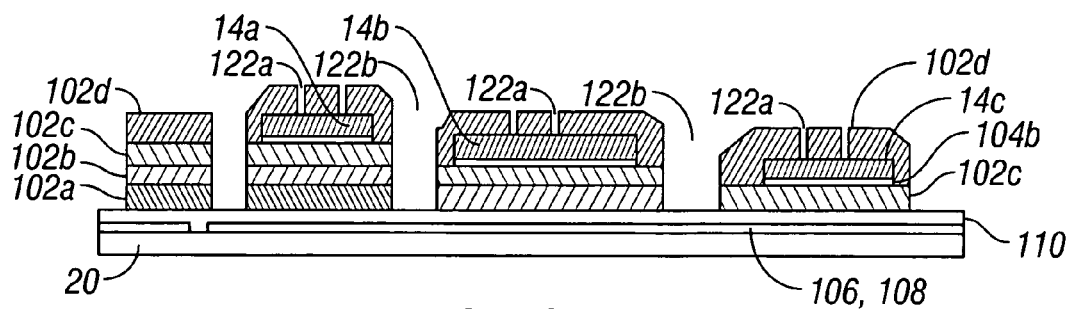
Figure 10D:
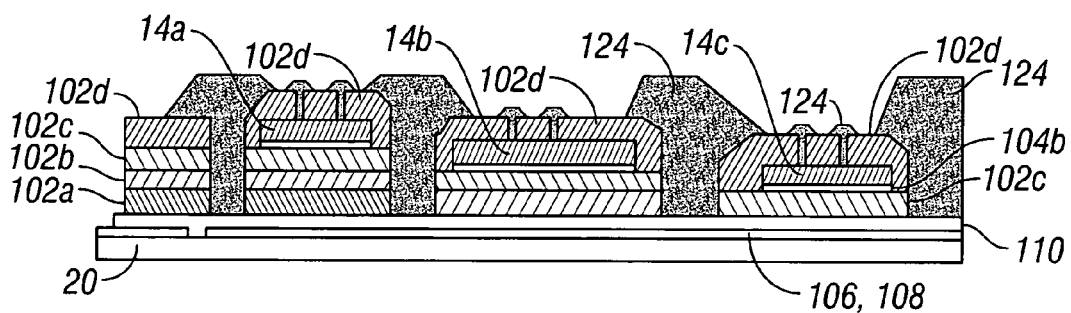
Figure 10E:
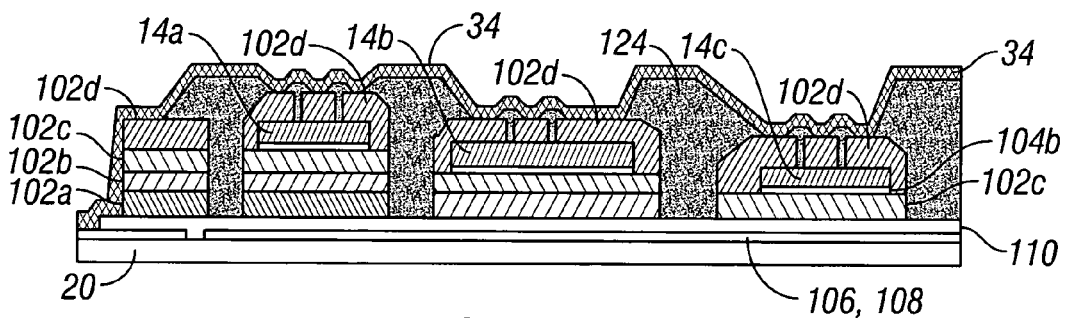
Figure 10F:
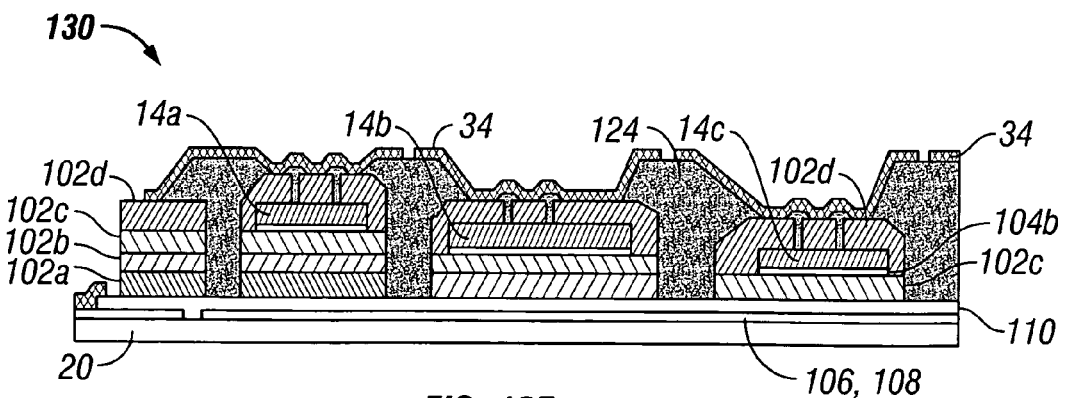
Figure 10G:
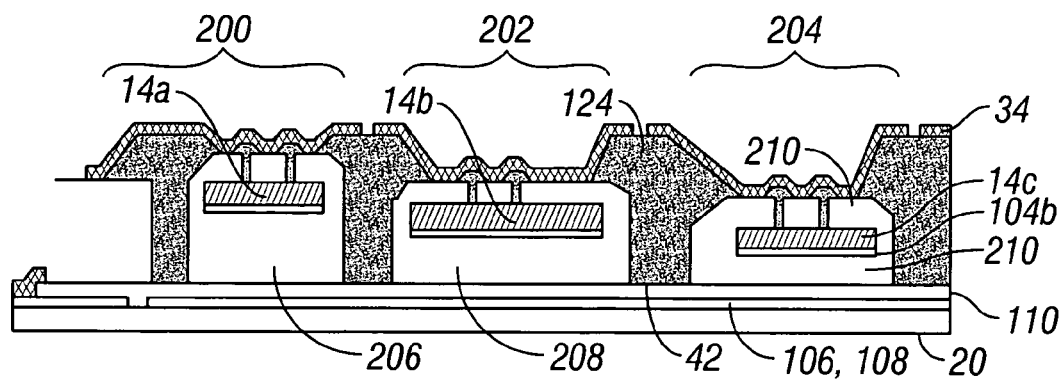
Figure 10H:
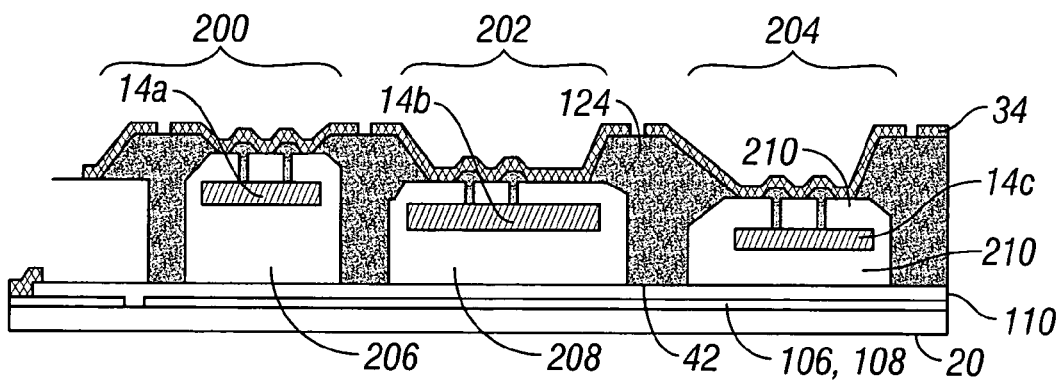

FIGS. 10A-10H are cross-sectional views illustrating various later steps following the process steps illustrated in FIGS. 9A-9E. In FIG. 10A, the second reflective layer 14 (comprising aluminum in this embodiment) has been patterned and etched using an appropriate etch chemistry for the removal of the metal. Such etch chemistries are known to those skilled in the art. For example, a PAN etchant (aqueous phosphoric acid/acetic acid/nitric acid) may be suitable for removing the metal. Remaining portions 14a, 14b, and 14c of the second reflective layer 14 are protected by a mask (not shown) and thus are not removed during etching. During etching of the second reflective layer 14 to form the second reflective layer portions 14a, 14b, and 14c, the etch stop layer 104 protects the underlying third sacrificial layer 102c from being etched. Etching of the second reflective layer 14 to form the portions 14a, 14b, and 14c exposes portions 104a of the etch stop layer 104. Unexposed portions 104b of the etch stop layer 104 underlie the remaining second reflective layer portions 14a, 14b, and 14c. The exposed portions 104a of the etch stop layer 104 may then optionally be removed (FIG. 10B) by further etching using a different etch chemistry (e.g., a hydrofluoric acid (HF) etchant or buffered oxide etchants (BOE) (i.e., blends of HF and ammonium fluoride)) that does not remove the third sacrificial layer 102c so that the portions 104b underlying the remaining metal reflective layer 14a, 14b, and 14c remain. Removal of the exposed portions 104a of the etch stop layer 104 ensures that no etch stop layer 104 material remains between sacrificial layers. This result permits use of etchants that do not etch the etch stop layer 104 material for patterning the sacrificial layers, such as to form post holes as described below. For example, most wet etchants that etch molybdenum do not etch silicon nitrides.

FIG. 10B illustrates the formation of a fourth sacrificial layer 102d over the patterned second reflective layer 14a, 14b, and 14c and the third sacrificial layer 102c. FIG. 10C illustrates forming connector holes 122a and post holes 122b by patterning and etching the sacrificial layers 102a, 102b, 102c, and 102d. In FIG. 10D, a planarization material 124 is optionally applied to fill in the connector holes 122a and post holes 122b. Examples of planarization materials include, but are not limited to, silicon dioxide, silicon nitride, organic materials (e.g., epoxies, acrylics, and vinyl-based chemistries), and silicon- or metal-containing organometallics. In one embodiment, various polyimides, low-k materials, and spin-on glasses may be used. FIG. 10E illustrates forming a mechanical film (flex or deformable layer) 34 by depositing a flexible material such as a metal over the planarization material 124 and the fourth sacrificial layer 102d, followed by patterning and etching the mechanical layer 34 to form columns or rows such that an array of unreleased interferometric modulators 130 is formed (FIG. 10F). In an embodiment (not shown), the planarization material 124 is not used, in which case the connector holes 122a and post holes 122b may be filled with the same material that is used to form the mechanical layer 34.

FIG. 10G illustrates removing the sacrificial layers 102a, 102b, 102c, and 102d to form the cavities 206, 208, 210, thereby exposing the portion 104b of the etch stop layer 104 underlying the remaining portions 14a, 14b, and 14c of the reflective layer 14. In this embodiment, the etch stop layer 104a underlying the second reflective layers 14a, 14b, and 14c that is exposed by the removal of the sacrificial layers 102a, 102b, 102c may be used to protect the second reflective layers 14a, 14b, and 14c during the etching of the sacrificial layers 102a, 102b, 102c, and 102d. For this embodiment, etchants may be used that etch the sacrifical layer material but not the etch stop layer material. For example, most wet etchants that etch molybdenum do not etch silicon nitrides.

The planarization material 42 is not removed by the etchant and thus remains to form posts 42 (FIG. 10H). The etch stop layer 104b underlying the second reflective layer 14a, 14b, and 14c may then itself be removed by etching using an appropriate etch chemistry (e.g., $SF_6$ plasma etch) as illustrated in FIG. 10H, thereby exposing the mirror surface of the second reflective layer 14a, 14b, and 14c.

Alternatively, gaseous or vaporous $XeF_2$ is used as an etchant to remove both the molybdenum sacrificial layers 46a, 46b, 46c, 46d and the etch stop layer 104b simultaneously. For example, as described further below, it has been surprisingly discovered that silicon-rich silicon nitride may be completely removed using a $XeF_2$ etch. It will be understood that $XeF_2$ may serve as a source of fluorine-containing gases such as $F_2$ and HF, and thus $F_2$ or HF may be used in place of or in addition to $XeF_2$ as an etchant for the preferred sacrificial materials, including molybdenum, amorphous silicon, germanium, and tungsten.

A comparison of FIGS. 10H and 9E illustrates that the size of the cavity 206 (FIG. 10H) corresponds to the combined thicknesses of the three sacrificial layers 102a, 102b, and 102c and the etch stop layer 104. Likewise, the size of the cavity 208 corresponds to the combined thickness of two sacrificial layers 102b and 102c and the etch stop layer 104, and the size of the cavity 210 corresponds to the combined thicknesses of the sacrificial layer 102c and the etch stop layer 104. Thus, the dimensions of the cavities 206, 208, and 210 vary according to the various combined thicknesses of the four layers 102a, 102b, 102c, and 104, resulting in an array of interferometric modulators 200, 202, and 204 capable of displaying three different colors such as red, green and blue.

The materials used for the fabrication of the sacrificial layer(s) 102, the reflective layer 14, and the etch stop layer 104 are preferably selected in combination with one another to bring about certain desired effects. In one embodiment, the etch stop layer 104 also serves as a diffusion barrier layer that slows diffusion of metal from the reflective layer 14 into the sacrificial material 102. It has been found that such diffusion is often undesirable because it tends to blur the boundary between the reflective layer and the sacrificial layer, resulting in reduced etch selectivity during processing and reduced mirror quality in the resulting interferometric modulator. The etch stop layer/barrier layer 104 preferably has a thickness in the range of about 300 Å to about 700 Å.

In one embodiment, the etch stop layer 104 also serves as a buffer layer that substantially prevents a crystallographic orientation of the sacrificial material 102 from producing a corresponding crystallographic orientation in the reflective layer 14. It has been found that some materials used to form the sacrificial layer display a crystallographic orientation after deposition and/or subsequent processing steps. For example, molybdenum is a crystalline material having a crystallographic orientation (typically body centered cubic) on any particular surface that results from the crystalline lattice spacing of the molybdenum atoms. When a reflective layer 14 is deposited directly onto a molybdenum sacrificial material 102, the depositing metal may tend to follow the crystallographic orientation of the underlying molybdenum, producing a corresponding crystallographic orientation in the reflective layer 14. The lattice spacing of the resulting deposited metal layer is often different than it would be in the absence of the underlying molybdenum, and in many cases the deposited metal layer is mechanically strained as a result. Upon removal of the sacrificial layer, the as-deposited lattice spacing of the metal atoms may relax to the natural lattice spacing for the metal, in some cases changing the dimensions of the reflective layer and producing undesirable warping.

For embodiments in which the etch stop layer 104 also serves as a buffer layer, the etch stop layer/buffer layer 104 is preferably amorphous or does not have the same lattice spacing as the underlying sacrificial layer 102. For example, silicon-rich silicon nitride is typically amorphous. The metal atoms deposit on the etch stop layer/buffer layer 104 rather than on the underlying sacrificial layer 102, and the buffer layer substantially prevents a crystallographic orientation of the sacrificial layer 104 from producing a corresponding crystallographic orientation in the reflective layer 14.

In one embodiment, the etch stop layer 104b also serves as a template layer having a crystalline orientation that is substantially similar to a crystallographic orientation of the reflective layer 14. As discussed above, a depositing metal may tend to follow the crystallographic orientation of the underlying layer, producing a corresponding crystallographic orientation in the metal layer. This tendency may be used to advantage by selecting, for use as an etch stop layer 104, a material that has a crystallographic orientation that would be desirable to impart to the reflective layer 14. An etch stop layer 104 formed of such a material thus serves as a crystallographic template that produces a substantially similar crystalline orientation in the subsequently deposited reflective layer 14.

The processing steps used to fabricate the interferometric modulators and arrays thereof described herein are preferably selected in combination with the materials used for the fabrication of the sacrificial layer 102, the reflective layer 14, and the etch stop layer 104 to bring about certain desired effects. For example, in one embodiment described above with reference to FIG. 10A, during etching of the second electrode or reflective layer 14 to form the portions 14a, 14b, and 14c, the etch stop layer 104 protects the underlying third sacrificial layer 102c from being etched. In another embodiment described above with reference to FIG. 10G, the etch stop layer 104b (underlying the second electrode or mirror layers 14a, 14b, and 14c) that is exposed by the removal of the sacrificial layers 102a, 102b, 102c protects the second mirror layers 14a, 14b, and 14c during the etching of the sacrificial layers 102a, 102b, 102c, 102d. Thus, the etch stop layer 104 may protect a sacrificial layer and/or a reflective layer from being etched during the removal of some other layer. During such etching, the material being etched is preferably removed at a rate that is at least about 10 times faster than the rate at which the etch stop layer is removed, preferably at least about 20 times faster. Thus, for example, with reference to FIG. 10A, during etching of the second reflective layer 14 to form the portions 14a, 14b, and 14c, the aluminum in the second reflective layer 14 is preferably removed by the etchant at a rate that is at least about 10 times faster than the rate at which the material in the etch stop layer 104 is removed by the etchant, and more preferably at least about 20 times faster. Likewise, with reference to FIG. 10G, if the etch stop layer 104 is not to be removed simultaneously with the sacrificial layer(s), during etching of the sacrificial layers 102a, 102b, 102c, and 102d, the material in the sacrificial layers is preferably removed at a rate that is at least about 10 times faster than the rate at which the material in the etch stop layer 104 is removed, and more preferably at least about 20 times faster.

With reference to FIGS. 10G-10H, the portions 104b of the etch stop layer 104 underlying the second electrode or reflective layer portions 14a, 14b, and 14c may be selectively removed by etching to expose the mirror surfaces of the second reflective layer portions 14a, 14b, and 14c in a manner that minimizes damage to the mirror surfaces. The etchant preferably removes the portions 104b of the etch stop layer 104 at a rate that is at least about 10 times faster than a rate at which the etchant removes the second mirror reflective layer portions 14a, 14b, and 14c, more preferably at least about 20 times faster.

The above embodiments are not intended to limit the present invention, and the methods described herein may be applied to any structure in which two materials having similar etching profiles are used in a proximate area and subjected to etching where selective etching is desired. Preferably, the methods described herein may be applied to increase etch selectivity between combinations of an Al-containing material and a Mo-containing material. No structural limitation or restriction is imposed or intended. Further, no limitation or restriction is imposed or intended on the particular formation sequence.

The methods described herein for the fabrication of interferometric modulators may use conventional semiconductor manufacturing techniques such as photolithography, deposition (e.g., "dry" methods such as chemical vapor deposition (CVD) and wet methods such as spin coating), masking, etching (e.g., dry methods such as plasma etch and wet methods), etc.

EXAMPLES

Example 1

A thin film of standard silicon nitride (silicon to nitrogen ratio of 3:4) formed on a substrate was tested for sensitivity to various etchants including PAD, PAN and $XeF_2$ etchants. A test pattern mask was applied to the standard silicon nitride films and the films were exposed to the etchants. After removing the pattern mask, any resulting step height was measured to determine sensitivity to the etchants. Exposure to the PAD etchant was at room temperature for a 10 minute soak. The standard silicon nitride film was only very slightly etched by the PAD etchant. Exposure to $XeF_2$ consisted of using two cycles of 120 s of gas fill time followed by 300 s of etching time. No etching of the standard silicon nitride was observed. Exposure to the PAN etchant was at room temperature for a 10 minute soak. No etching of the standard silicon nitride was observed. Thus, standard silicon nitride is not sensitive to PAD, PAN, or $XeF_2$ etchants.

Example 2

Test wafers were constructed using five different deposition conditions to form various silicon nitride films on glass or silicon wafers. The silicon nitride films were formed by Micralyne, Inc. of Edmonton Alberta using plasma enhanced chemical vapor depositionon (PECVD) by reaction between $SiH_4$ and $NH_3$. All silicon nitride films were fromed at a pressure of 900 mTorr and a temperature of 350° C. RF power for generating the plasa was 20 W. The gas flow rates, deposition rates (DR), and measured refractive indices (RI) of the resulting films are indicated in Table 1.

TABLE 1

Reaction conditions for silicon nitride test wafers.

| Wafer No. | $SiH_4$ (sccm) | $NH_3$ (sccm) | $SiH_4/NH_3$ | $N_2$ (sccm) | DR (Å/min) | RI |
|---|---|---|---|---|---|---|
| 1 | 40 | 40 | 1 | 1960 | 118 | 2.12 |
| 2 | 80 | 40 | 2 | 1960 | 169 | 2.45 |
| 3 | 40 | 20 | 2 | 1960 | 151 | 2.35 |
| 4 | 60 | 40 | 1.5 | 1960 | 142 | 2.28 |
| 5 | 40 | 10 | 4 | 1960 | 213 | N/A |

The sensitivities of these test films to etching by $XeF_2$ and PAN etchants were determined by applying a test pattern mask and then exposing the films to the respective etchants. The pattern mask was then removed and any resulting step heights measured. The $XeF_2$ etch test consisted of exposing the five films formed on glass wafers to two cycles of 120 s $XeF_2$ gas fill time followed by 300 s of etch time. The PAN etch test consisted of soaking the five films formed on silicon wafers in PAN etchant for 10 minutes. The PAN etchant resulted in no observable etching of any of the silicon nitride films. In contrast, the silicon-rich silicon nitride films (e.g., those formed by reaction conditions 2-5) were sensitive to $XeF_2$ etching. Table 2 lists the observed step heights formed from $XeF_2$ etching of the test pattern.

TABLE 2

Step heights caused by $XeF_2$ etching.

| Wafer No. | Step Height (Å) |
|---|---|
| 1 | 0 |
| 2 | 87 |
| 3 | 89 |
| 4 | 65 |
| 5 | 73 |

Figure 11:
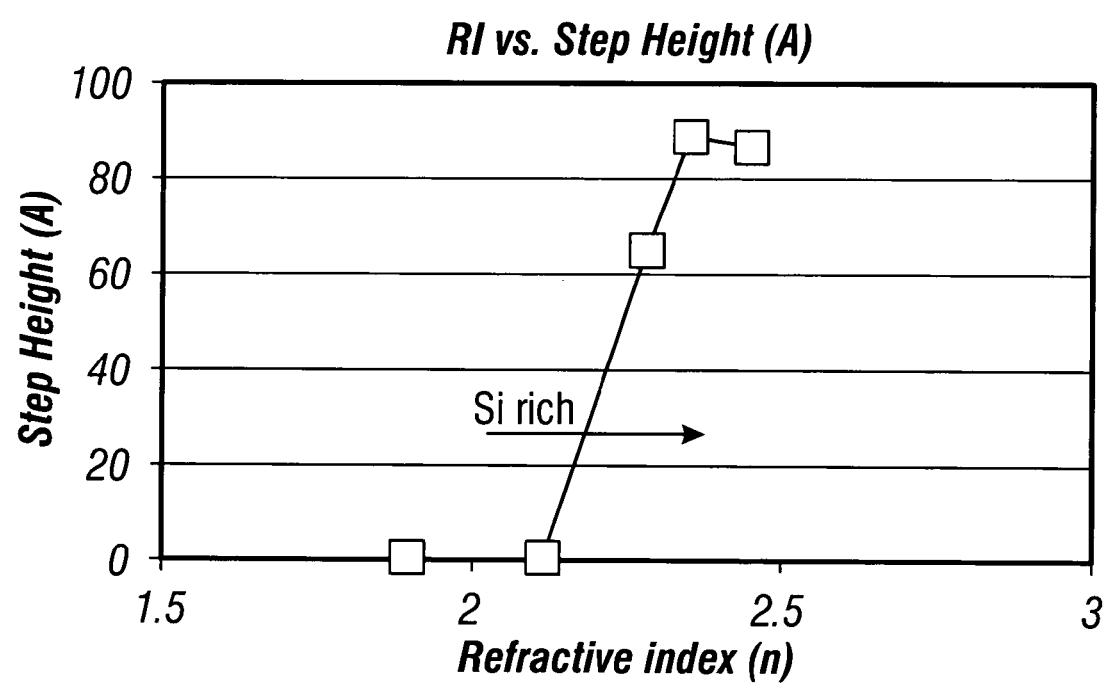
FIG. 11 is a graph depicting $XeF_2$ etch step height as a function of silicon-rich silicon nitride refractive index.

FIG. 11 depicts a graph showing the observed step height as a function of refractive index. Also included in the graph is the standard silicon nitride tested in Example 1, with a refractive index of about 1.9. This data indicates that as the refractive index increases, the sensitivity to $XeF_2$ etching generally increases. The refractive index of standard silicon nitride (i.e., a 3:4 ratio of silicon to nitrogen) is approximately 1.9 to 2.1. The reactive index of pure silicon is 3.7. Accordingly, increasing refractive indices above 2.1 indicate increasing amounts of silicon in the silicon nitride films (e.g., silicon-rich silicon nitride). These increasing refractive indices also correlate with the increase in $SiH_4/NH_3$ reactant ratios (Table 1). Thus, unlike standard silicon nitride (i.e., a 3:4 ratio), silicon-rich silicon nitride films are sensitive to $XeF_2$ etching and can therefore be cleanly removed during $XeF_2$ release etching in interferometric modulators.

Example 3

Test wafers were constructed using four different deposition conditions to form various silicon nitride films on glass or silicon substrates. The silicon nitride films were formed using plasma enhanced chemical vapor deposition by reaction between $SiH_4$ and $NH_3$. All silicon nitride films were formed at a pressure of 650 mTorr. RF power for generating the plasma was 25 W. The gas flow rates, temperature, deposition rates (DR), and measured refractive indices (RI) of the resulting films are indicated in Table 3. Condition 1 corresponds to deposition conditions resulting in standard silicon nitride (i.e., a silicon to nitrogen ratio of 3:4). Condition 4 corresponds to the standard conditions except for a lower reaction temperature. Increasing the ratio of the $SiH_4$ reactant to $NH_3$ resulted in an increase in refractive index, indicating an increase in the silicon content of the resulting film.

TABLE 3

Reaction conditions for silicon nitride test wafers.

| Wafer No. | $NH_3$ (sccm) | $SiH_4$ (sccm) | T (° C.) | RI | DR (Å/min) | Film Thickness (Å) |
|---|---|---|---|---|---|---|
| 1 | 35 | 40 | 350 | 2.07 | 93.1 | 931 |
| 2 | 20 | 40 | 350 | 2.32 | 78.7 | 787 |
| 3 | 10 | 40 | 350 | 3 | 59.2 | 592 |
| 4 | 35 | 40 | 250 | 2.03 | 95.9 | 959 |

The sensitivities of these test films to etching by $XeF_2$ and PAN etchants were determined by applying a test pattern mask and then exposing the films to the respective etchants. The pattern mask was then removed and any resulting step heights measured. The $XeF_2$ etch test consisted of exposing the four films to four cycles of 120 s $XeF_2$ gas fill time followed by 300 s of etch time. The PAN etch test consisted of soaking the four films in PAN etchant for 10 minutes. The PAN etchant resulted in no observable etching of the silicon nitride films. On glass wafers, standard silicon nitride (e.g., wafer no. 1) also showed no observable etching as a result of exposure to $XeF_2$. In contrast, silicon-rich silicon nitride films on glass wafers (e.g., wafer nos. 2 and 3) were sensitive to $XeF_2$, resulting in measurable step heights where the film was etched. The wafer no. 4 silicon nitride films showed some sensitivity to $XeF_2$ etching, however, the resulting step heights were not consistent.

All of the silicon nitride films were sensitive to $XeF_2$ etching on a silicon substrate, however, standard silicon nitride (e.g., wafer no. 1) was not completely removed. In contrast, the silicon-rich silicon nitride films on silicon substrates were completely removed upon $XeF_2$ etching.

It will be appreciated by those skilled in the art that various omissions, additions and modifications may be made to the processes described above without departing from the scope of the invention, and all such modifications and changes are intended to fall within the scope of the invention, as defined by the appended claims.

What is claimed is:

1. An unreleased MEMS device, comprising:
   a silicon nitride layer positioned between a sacrificial layer and an electrode layer, wherein the electrode layer is adapted to be movable upon removal of the sacrificial layer and the ratio of silicon to nitrogen in the silicon nitride layer is greater than 3:4,
   wherein the unreleased MEMS device is an unreleased interferometric modulator and the electrode layer comprises a metal mirror.

2. The unreleased MEMS device of claim 1, wherein the electrode layer is positioned over the sacrificial layer.

3. The unreleased MEMS device of claim 1, wherein the ratio of silicon to nitrogen in the silicon nitride layer is greater than about 1:1.

4. The unreleased MEMS device of claim 1, wherein the sacrificial layer is sensitive to removal by a $XeF_2$ etchant.

5. The unreleased MEMS device of claim 1, wherein the sacrificial layer comprises a material selected from the group consisting of amorphous silicon, germanium, molybdenum, and tungsten.

6. The unreleased MEMS device of claim 1, wherein the silicon nitride layer is sensitive to removal by an etchant that is also capable of removing the sacrificial layer.

7. The unreleased MEMS device of claim 1, wherein the electrode layer comprises aluminum.

8. The unreleased MEMS device of claim 1, wherein the silicon nitride layer is adapted to substantially prevent interdiffusion between the electrode layer and the sacrificial layer.

9. The unreleased MEMS device of claim 1, wherein the silicon nitride layer is adapted to substantially prevent a crystallographic orientation of the sacrificial layer from producing a corresponding crystallographic orientation in the electrode layer.

10. The unreleased MEMS device of claim 1, wherein the silicon nitride layer has a refractive index greater than about 2.1.

11. The unreleased MEMS device of claim 10, wherein the silicon nitride layer has a refractive index greater than about 2.2.

12. The unreleased MEMS device of claim 1, wherein the sacrificial layer is selected from the group of molybdenum and amorphous silicon and the electrode layer comprises aluminum.

13. An unreleased MEMS device, comprising:
    a silicon nitride layer positioned between a sacrificial layer and an electrode layer, wherein the electrode layer is adapted to be movable upon removal of the sacrificial layer, wherein:
       the silicon nitride layer is of a composition that is susceptible to removal by a fluorine containing gas and substantially resistant to a phosphoric acid/acetic acid/nitric acid etchant,
       the sacrificial layer is of a composition that is susceptible to removal by the fluorine containing gas, and
       the electrode layer is of a composition that is susceptible to removal by the phosphoric acid/acetic acid/nitric acid etchant.

14. The unreleased MEMS device of claim 13, wherein the electrode layer is positioned over the sacrificial layer.

15. The unreleased MEMS device of claim 13, wherein the unreleased MEMS device is an unreleased interferometric modulator and the electrode layer comprises a metal mirror.

16. The unreleased MEMS device of claim 13, wherein the sacrificial layer is selected from the group consisting of molybdenum and amorphous silicon and the electrode layer comprises aluminum.

17. The unreleased MEMS device of claim 13, wherein the the fluorine containing gas is $XeF_2$.

18. A method of manufacturing a MEMS device, comprising:
    forming a sacrificial layer;
    forming an electrode layer, wherein the electrode layer is adapted to be movable upon removal of the sacrificial layer, wherein the MEMS device is an interferometric modulator and the electrode layer comprises a metal mirror;
    forming a silicon nitride layer between the sacrificial layer and the electrode layer, wherein the ratio of silicon to nitrogen in the silicon nitride layer is greater than about 3:4;
    patterning the electrode layer; and
    removing the sacrificial layer.

19. The method of claim 18, wherein the ratio of silicon to nitrogen in the silicon nitride layer is greater than about 1:1.

20. The method of claim 18, wherein forming the sacrificial layer comprises depositing a material selected form the group consisting of molybdenum, amorphous silicon, germanium, and tungsten.

21. The method of claim 18, wherein forming the silicon nitride layer comprises reacting silane with ammonia on a surface of the sacrificial layer.

22. The method of claim 18, wherein forming the silicon nitride layer comprises depositing silicon nitride on a surface of the sacrificial layer using physical vapor deposition.

23. The method of claim 18, wherein forming the electrode layer comprises depositing aluminum onto the silicon nitride layer.

24. The method of claim 18, wherein patterning the electrode layer comprises etching the electrode layer using an etchant that does not remove the silicon nitride layer.

25. The method of claim 18, wherein removing the sacrificial layer comprises etching the sacrificial layer with an etchant that also removes the silicon nitride layer.

26. The method of claim 18, further comprising patterning the silicon nitride layer after patterning of the electrode layer and prior to removing the sacrificial layer.

27. An interferometric modulator manufactured by the process of claim 18.

28. A method of manufacturing a MEMS device, comprising:

forming a sacrificial layer;

forming an electrode layer, wherein the electrode layer is adapted to be movable upon removal of the sacrificial layer;

forming an etch stop layer between the sacrificial layer and the electrode layer;

patterning the electrode layer; and removing the sacrificial layer and etch stop layer with a same etchant.

29. The method of claim 28, wherein the etch stop layer comprises a silicon nitride.

30. The method of claim 29, wherein the etch stop layer has a refractive index greater than about 2.1.

31. The method of claim 28, wherein the MEMS device is an interferometric modulator and the electrode layer comprises a metal mirror.

32. The method of claim 28, where the etchant comprises xenon fluoride.

33. The method of claim 28, wherein:

forming the sacrificial layer comprises depositing a material selected from the group consisting of molybdenum, amorphous silicon, germanium, and tungsten;

forming the etch stop layer comprises forming silicon nitride on the sacrificial layer; and forming the electrode layer comprises depositing aluminum onto the silicon nitride.

34. A MEMS device manufactured by the process of claim 28.

* * * * *

UNITED STATES PATENT AND TRADEMARK OFFICE
CERTIFICATE OF CORRECTION

PATENT NO. : 7,382,515 B2
APPLICATION NO. : 11/334990
DATED : June 3, 2008
INVENTOR(S) : Chung et al.

It is certified that error appears in the above-identified patent and that said Letters Patent is hereby corrected as shown below:

Title Page, Item (57) (Abstract), Line 3, delete "a an" and insert -- an --, therefor.

Title Page, Item (57) (Abstract), Line 6, delete "and or" and insert -- and/or --, therefor.

Title Page at Page 3, Item (56), (U.S. Patent Documents), Line 20, delete "Goosen" and insert -- Goossen --, therefor.

Title Page at Page 3, Item (56), (U.S. Patent Documents), Line 36, delete "Goosen" and insert -- Goossen --, therefor.

Title Page at Page 3, Item (56), (U.S. Patent Documents), Line 38, delete "Goosen" and insert -- Goossen --, therefor.

Title Page at Page 4, Item (56), (U.S. Patent Documents), Line 68, delete "Atta et al." and insert -- Atia et al. --, therefor.

Title Page at Page 5, Item (56), (Other Publications), Line 19, delete "pp. 1119,." and insert -- pp. 1119, --, therefor.

Title Page at Page 6, Item (56), (Other Publications), Line 20, delete "Internatioal" and insert -- International --, therefor.

Title Page at Page 6, Item (56), (Other Publications), Line 20, delete "Andactuators" and insert -- And Actuators --, therefor.

UNITED STATES PATENT AND TRADEMARK OFFICE
CERTIFICATE OF CORRECTION

| | |
|---|---|
| PATENT NO. | : 7,382,515 B2 |
| APPLICATION NO. | : 11/334990 |
| DATED | : June 3, 2008 |
| INVENTOR(S) | : Chung et al. |

It is certified that error appears in the above-identified patent and that said Letters Patent is hereby corrected as shown below:

Title Page at Page 6, Item (56), (Other Publications), Line 21, delete "Youk" and insert -- York --, therefor.

Title Page at Page 6, Item (56), (Other Publications), Line 49, delete "systesm" and insert -- systems --, therefor.

Title Page at Page 6, Item (56), (Other Publications), Line 50, delete "Comparision" and insert -- Comparison --, therefor.

At Column 2, Line 40, after "FIG. 1" insert -- . --.

At Column 9, Line 13, delete "on." and insert -- on --, therefor.

At Column 10, Line 19, delete "sacrifical" and insert -- sacrificial --, therefor.

At Column 11, Line 10 (approximately), delete "of." and insert -- of --, therefor.

At Column 11, Line 32 (approximately), delete "$Sio_2$" and insert -- $SiO_2$ --, therefor.

At Column 14, Line 48, delete "sacrifical" and insert -- sacrificial --, therefor.

At Column 15, Line 64, delete "104balso" and insert -- 104b also --, therefor.

At Column 16, Line 26 (approximately), delete "14cduring" and insert -- 14c during --, therefor.

UNITED STATES PATENT AND TRADEMARK OFFICE
CERTIFICATE OF CORRECTION

PATENT NO. : 7,382,515 B2
APPLICATION NO. : 11/334990
DATED : June 3, 2008
INVENTOR(S) : Chung et al.

It is certified that error appears in the above-identified patent and that said Letters Patent is hereby corrected as shown below:

At Column 17, Line 39, delete "depositionon" and insert -- deposition --, therefor.

At Column 17, Line 40, delete "fromed" and insert -- formed --, therefor.

At Column 17, Line 42, delete "plasa" and insert -- plasma --, therefor.

At Column 18, Line 23 (approximately), delete "reactive" and insert -- refractive --, therefor.

At Column 20, Line 26, delete "the the" and insert -- the --, therefor.

Signed and Sealed this

Twentieth Day of January, 2009

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,382,515 B2 |
| APPLICATION NO. | : 11/334990 |
| DATED | : June 3, 2008 |
| INVENTOR(S) | : Won Suk Chung, Steve Zee and Teruo Sasagawa |

It is certified that error appears in the above-identified patent and that said Letters Patent is hereby corrected as shown below:

At First Page, Column 1 (Inventors), please delete "Wonsuk" and insert --Won Suk--, therefor.

Signed and Sealed this

Fifteenth Day of September, 2009

David J. Kappos
*Director of the United States Patent and Trademark Office*